United States Patent [19]

Lampe et al.

[11] 4,034,199
[45] July 5, 1977

[54] PROGRAMMABLE ANALOG TRANSVERSAL FILTER

[75] Inventors: Donald R. Lampe, Ellicott City; Marvin H. White, Laurel; James H. Mims, Linthicum Heights, all of Md.

[73] Assignee: Westinghouse Electric Corporation, Pittsburgh, Pa.

[22] Filed: Dec. 8, 1975

[21] Appl. No.: 638,569

Related U.S. Application Data

[63] Continuation of Ser. No. 507,115, Sept. 17, 1974, abandoned.

[52] U.S. Cl. .......................... 235/193; 307/221 D; 328/167; 333/70 T; 340/173 R
[51] Int. Cl.² ................ G11C 11/40; H03K 5/159
[58] Field of Search ............... 235/193; 325/42; 340/173 R; 307/238, 221 C, 221 D; 357/24, 45; 333/18, 28, 70 T; 328/167

[56] References Cited

UNITED STATES PATENTS

| | | | |
|---|---|---|---|
| 3,518,547 | 6/1970 | Filipowsky | 325/42 |
| 3,641,512 | 2/1972 | Bentchkowsky | 340/173 R |
| 3,763,480 | 10/1973 | Weimer | 340/173 R |
| 3,809,923 | 5/1974 | Esser | 307/221 D |
| 3,824,564 | 2/1974 | Wegener | 340/173 R |

Primary Examiner—Joseph F. Ruggiero
Attorney, Agent, or Firm—D. Schron

[57] ABSTRACT

A programmable analog transversal filter is disclosed for processing analog signals and comprising a charge-coupled device (CCD) for receiving a series of discrete analog signals to be delayed by increasing periods and applied to the outputs of the CCD, and a plurality of MNOS memory devices coupled to the taps of the CCD and programmed so that the output of a CCD tap is multiplied by a particular factor. In turn, the outputs of the MNOS memory devices are summed to provide an output signal $$e_o(t) = \sum_{k=1}^{N} W_k \cdot e(t - kT),$$

where $W_k$ is the weighting factor associated the $k^{th}$ MNOS memory device. The weighting factors are set into the system by varying the threshold voltage of the corresponding MNOS device. Positive and negative weighting factors are implemented by using first and second MNOS memory elements for each tap of the CCD, whereby depending upon the program incorporated into the system, one of the first and second MNOS memory devices is programmed to give either a positive weighting factor and the other MNOS memory device a negative weighting factor. Further, a reiterative method of setting the weights into the MNOS memory device is used to compare the system output indicative of the weighting factor as set into the MNOS memory devices, with the desired weighting factor as stored in a suitable storage memory such as a ROM, whereby a correction signal is developed to adjust the threshold voltage $V_{Th}$ of the MNOS memory device in accordance with the stored weighting factor. In one illustrative embodiment, the weighting factors are set in accordance with sinusoidal signals, whereby the system performs a filtering function to provide an output upon receipt of an input signal of desired frequency. In addition, the MNOS devices are reprogrammable, thus permitting a single such system to be used in many different applications. In this regard, this system is particularly adapted for complex signal processing including filtering, generating desired functions, synthetic aperture radar signal processing and target identification processing.

17 Claims, 51 Drawing Figures

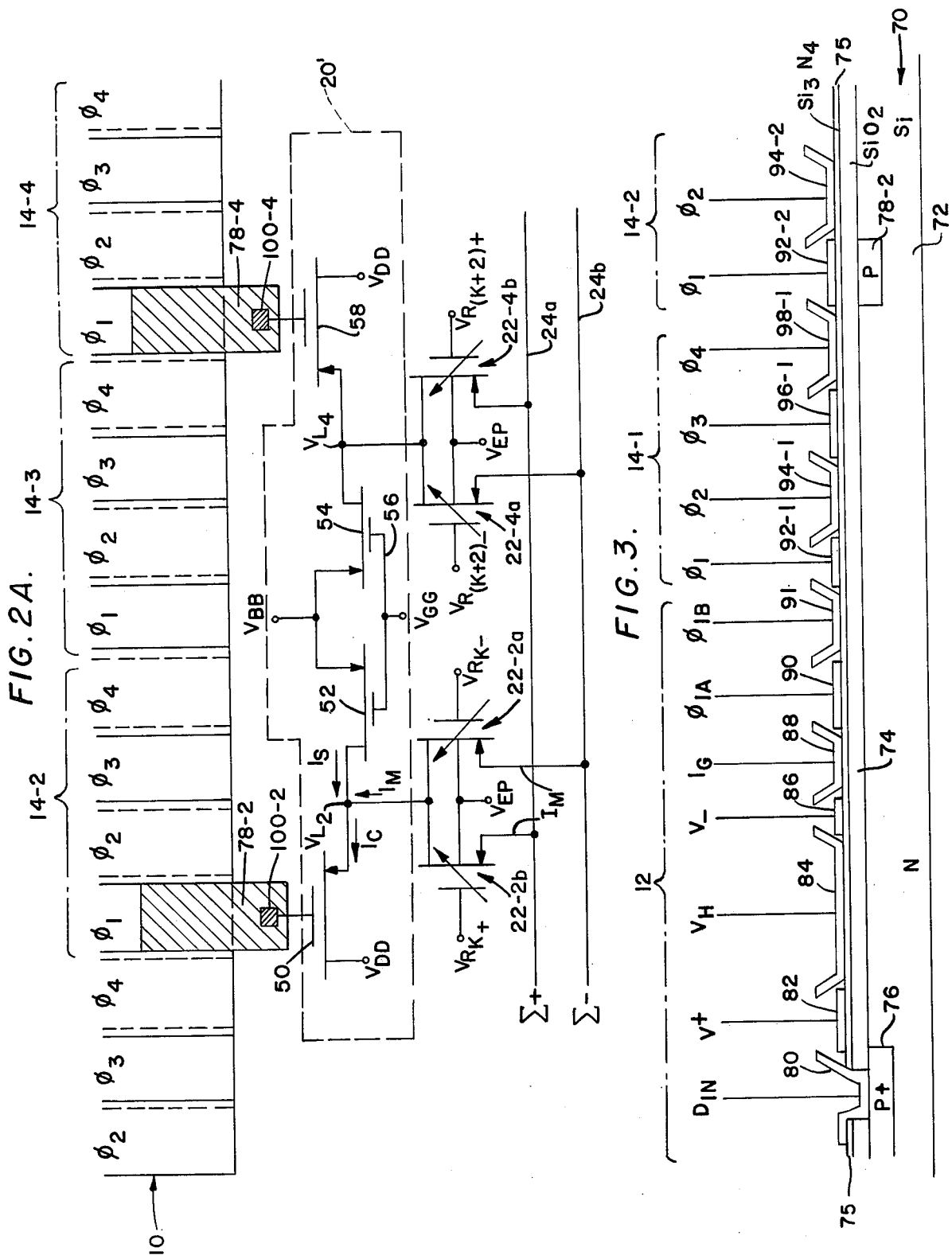

IN FIGS. 5A–5K, HIGH LEVEL REPELS AND LOW LEVEL ATTRACTS CCD CHARGE

SWITCHING WAVEFORMS OF FIGS. 5L–5O:

HIGH ⟶ SWITCH CLOSED
LOW ⟶ SWITCH OPEN

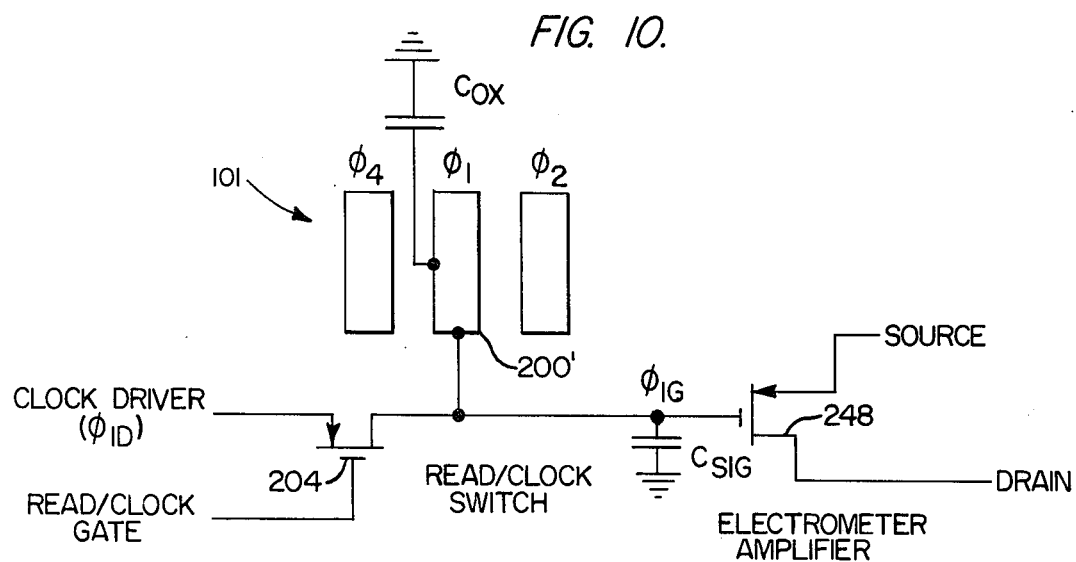
FIG. 10.
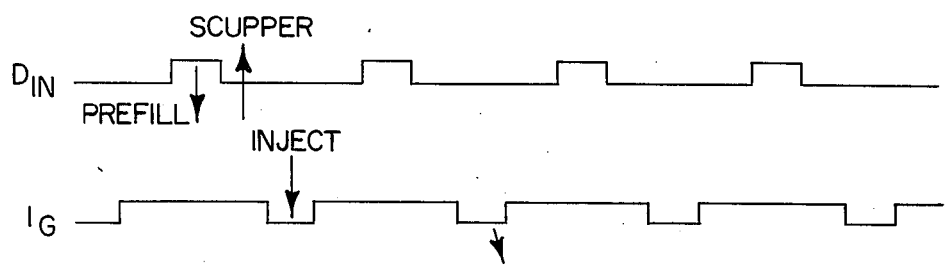
FIG. 11A.
FIG. 11B.
FIG. 11C.
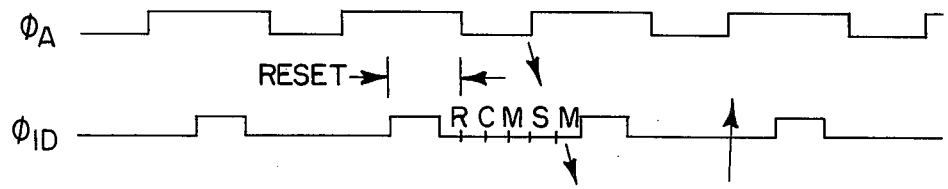
FIG. 11D.
FIG. 11E.
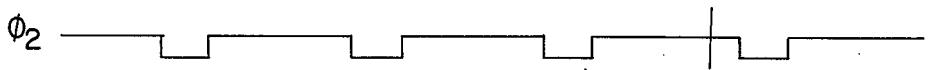
FIG. 11F.
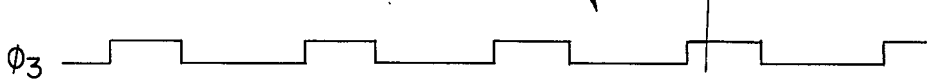
FIG. 11G.
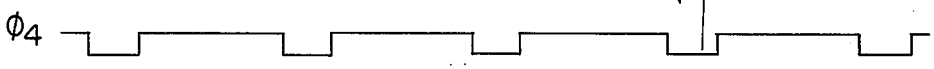
FIG. 11H.
FIG. 11J.
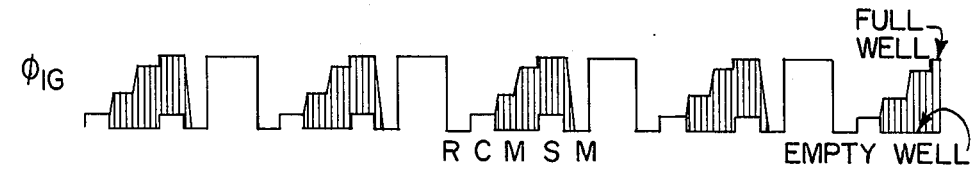

PROGRAMMABLE ANALOG TRANSVERSAL FILTER

This is a continuation of application Ser. No. 507,115 filed Sept. 17, 1974, now abandoned.

CROSS REFERENCE TO RELATED APPLICATIONS

Reference is made to the following related patent applications, each of which is assigned to the present assignee and specifically incorporated herein by reference:

Ser. No. 437,650, entitled "The Structure of and the Method of Processing a Semiconductor Matrix of MNOS Elements", filed Jan. 29, 1974 in the names of James R. Cricchi and Barry W. Ruehling;

Ser. No. 437,649, entitled "Block-Oriented Random Access Memory", filed Jan. 29, 1974 in the names of James R. Cricchi and Franklyn C. Blaha; and Ser. No. 506,906, entitled "Discrete Analog Processing System Including a Matrix of Memory Elements", filed concurrently herewith in the name of James H. Mims.

BACKGROUND OF THE INVENTION

Field of the Invention

This invention relates generally to discrete analog signal processing and more particularly to such systems as comprised of charge transfer devices (CTD's) for sampling and providing discrete delays to an input signal and an array of MNOS memory devices capable of being programmed to multiply the outputs of the CTD device in accordance with a defined function. Such CTD and MNOS devices are particularly adapted to be implemented by large-scale integration (LSI) techniques.

Description of the Prior Art

In the prior art, digital signal processing (DSP) has been utilized in many applications in view of the low cost of the integrated circuits that are available to perform many functions in digital fashion. As compared with analog techniques, DSP has been preferred in that its use of digital implementation has been considered to be preferable in view of cost, weight, flexibility and accuracy considerations. By contrast, the only present advantage of analog techniques is its lower power consumption, which advantage may gradually disappear as technology advances. A further technique known as discrete analog signal processing (DASP) provides an alternative to the aforementioned methods of signal processing and is implemented by sampling at regular intervals an analog signal to provide a series of analog signals or bits, each of which may be operated upon one-at-a-time and have an amplitude containing information or data corresponding to M digital bits, where one bit of resolution in DSP is equivalent to 6dB dynamic range in the analog signal. Experiments have shown that a signal-charge analog packet can be shifted through a typical CCD nearly unattenuated, limited by the size of the holding wells and the minimum detectable output signal.

As more fully described in an article entitled, "Charge Coupled Semiconductor Devices" appearing in *Bell System Technical Journal*, April 1970, by W. S. Boyle and G. E. Smith, CCD's sample an analog input signal to provide a series of analog bits to be stored in potential wells created at the surface of a semiconductor and transported along the surface by timing or phase signals. More particularly, these charges constitute minority carriers stored at the silicon-silicon dioxide interface of MNOS non-memory capacitors and are transferred from capacitor or well to capacitor or well on the same substrate by manipulating the voltages applied across the capacitor.

As described in an article entitled, "Transversal Filtering Using Charge Coupled Devices" by D. D. Buss, D. R. Collins, W. H. Bailey and C. R. Reeves, published in the *IEEE Journal of Solid State Circuits*, SC-8, pp. 138–46, April 1973, CCD's may be adapted for analog signal processing and in particular, for use as transversal filters wherein the CCD's effect a serial transfer of charge packets along a linear path. At each stage, the amount of charge may be non-destructively measured at its corresponding tap. To form a transversal filter, the tap outputs are appropriately weighted and summed. As suggested in the noted article, a tap weight may be provided by dividing each stage of the CCD into two portions and sensing only charge on one of them through the capacitor electrode. Summation of the charge residing on all the selected taps is performed by connecting all of the capacitor electrodes to a common drive circuit and monitoring the drive current required to charge or to discharge them. Thus, the multiplicative tap weights are determined by the location of the cuts in the capacitor electrode plates and the addition is performed by strapping the capacitor electrodes together. However, the weights provided by the described electrode configuration are fixed and there is no suggestion as to how tap error may be compensated for. Further, the analog signals are mixed with clock currents and the dynamic range of such a system is restricted.

A cross-correlator performs similar functions as a transversal filter, differing in that the tap weights are set in accordance with a second input signal. Thus, a cross-correlator can implement all of the possible transversal filter functions and may be considered as a truly general-purpose signal processing device. However, a cross-correlator requires that the tap weights be programmable in accordance with an input signal. The above-described method for achieving tap weights by cutting the capacitor plate results in a fixed weighting unsuitable for cross-correlator devices. Thus, the noted article by Buss et al concludes that "there is no convenient way of obtaining an electrically variable multiplicative fraction of the surface charge in the storage reservoir", thus eliminating use of the described system for such purpose.

Further, there has been suggested the use of transistors of different conductances to provide the desired weighting at the non-destructive taps of the CCD device. Although this approach avoids the mixing of analog and digital transients, the weights provided by the transistors are still fixed, thus limiting the flexibility of the resulting system and in particular making it unsuitable for use as a cross-correlator as noted above.

SUMMARY OF THE INVENTION

It is therefore an object of this invention to provide a flexible system for effecting discrete analog signal processing (DASP).

It is a more particular object of this invention to use a programmable MNOS device as a weighting device to be coupled to the taps of a charge transfer device, whereby complex DASP may be effected.

In accordance with these and other objects of this invention, there is provided a discrete analog signal processing system comprising a sampling and storing means in the form of a charge transfer device (CTD), for providing at its plurality of outputs or taps the sampled signal, and a plurality of programmable weighting elements in the form of MNOS devices coupled to the CTD's taps, whereby the outputs of the CTD may be variably weighted in accordance with a desired program. Such a system permits the implementation of complex DASP and in particular the implementation of Fourier transformers, matched filters, correlators and adaptive-type filters.

In one aspect of this invention, negative and positive (as well as real and imaginary) coefficients or weights may be applied to the outputs of the sample and store means by incorporating first and second MNOS devices to be programmed respectively in accordance with the positive and negative weighting factors. In addition, the outputs of each of the first and second MNOS devices are connected respectively to a summing bus, whereby the outputs of each of the sets of negative and positive weighting factors may be summed together. In this regard, the MNOS devices are programmed in accordance with a set of weighting factors whereby only the difference between conductances of the first and second weighting devices associated with an output of the CTD device is programmed to give the desired negative or positive weighting factor.

In a further aspect of this invention, a set of weighting factors is stored in a suitable memory to be read out and applied in sequence to the corresponding MNOS weighting devices. A test signal is applied to the CTD and stepped along its corresponding stages, whereby an output signal is developed sequentially at the output taps of the CTD device. The output is multiplied by each of the MNOS weighting devices and their outputs are applied to a comparator for comparing, in effect, the output from each of the weighting devices with the weighting factor as stored in the memory. If a difference is detected, the comparator generates an error signal, whereby the weighting factor as set into the corresponding MNOS device is readjusted to the desired value.

In a still further aspect of this invention, the weighting factor is set into each of the MNOS devices by adjusting its threshold voltage. In one illustrative method, a single pulse is applied to the gate of the MNOS weighting device to increase or decrease its threshold voltage in accordance with the desired weighting factor. Alternatively, an adjustment to the weighting factor, either to increase or to decrease, is made by generating a burst of bipolar signals, the sum of which is negative or positive for effecting, respectively, an increase or decrease in the threshold voltage of the MNOS device and therefore its weighting factor.

In one particular embodiment of this invention, a shift register is used in the programming operation as well as in the normal signal processing operation of an input signal. In the programming operation, a single pulse is applied to the shift register and sequentially transferred from stage to stage in synchronism with the test pulse applied to the CTD. The output of each stage of the shift register is coupled to a switch actuated in response thereto for applying a signal corresponding to the weighting factor to the selected MNOS weighting device. In this manner, the threshold voltage of each of the MNOS devices is set in accordance with its desired weighting factor. In the normal signal processing mode of operation, a series of pulses is applied to the shift register, whereby each of the switches associated with the MNOS devices is actuated to apply a common read voltage to the gates of each of the MNOS weighting factors. In this manner, in the normal mode of operation, the outputs of the CTD device are weighted by their corresponding MNOS weighting devices and summed together to provide the desired output. In one illustrative embodiment of this invention, the weighting factors are set in accordance with a sinusoidal signal, whereby the system operates as a filter to provide an output when an input of a selected frequency is received.

BRIEF DESCRIPTION OF THE DRAWINGS

These and other objects and advantages of the present invention will become more apparent by referring to the following detailed description and accompanying drawings, in which:

FIGS. 2A and 2B are, respectively, a more detailed view of the interconnection of the MNOS devices between the outputs of the CCD and the summing buses, and an alternate scheme of CCD readout and multiplicative weighting;

FIG. 3 is a general, cross-sectional view of the CCD and the electrode connections thereto;

FIG. 10 is a general, schematic diagram of an alternative structure for reading the parallel outputs of the CCD and multiplicatively weighting them, as shown in more detail in FIG. 2B;

FIGS. 11A to 11H show, respectively, the pulse-like signals to be applied to the CCD device, while FIG. 11J illustrates the voltage waveform appearing at electrode $\phi_{1G}$, as shown in FIGS. 2B and 10;

FIGS. 13A to 13J show in step-by-step fashion the manner in which an array incorporating the CCD 10 and a memory device 22 is processed.

BRIEF DESCRIPTION OF THE PREFERRED EMBODIMENTS

Figure 1A:
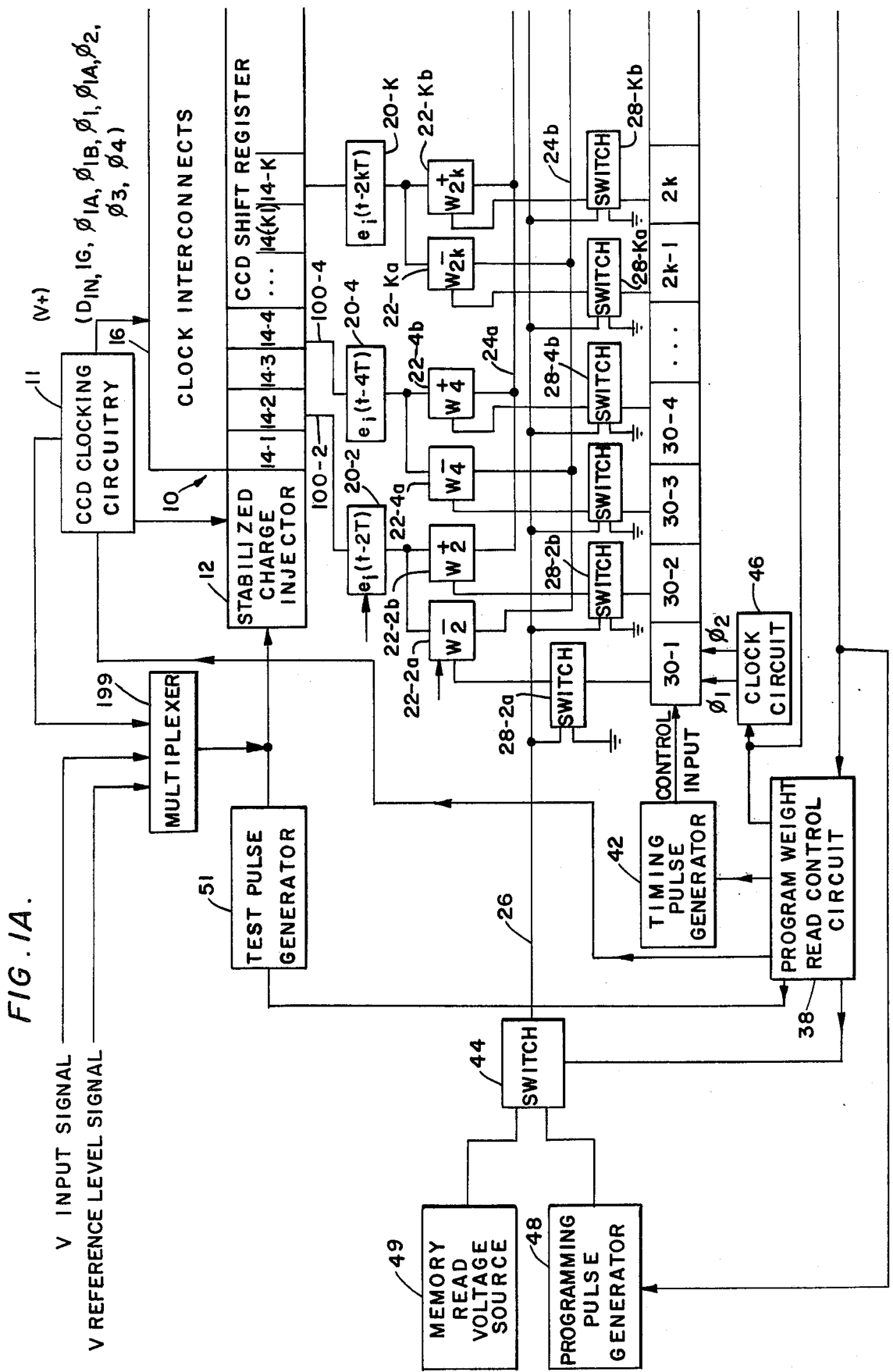
FIGS. 1A and 1B are functional block diagrams of a DASP system incorporating a CCD and a plurality of programmable MNOS devices, in accordance with teachings of this invention.
Figure 1B:
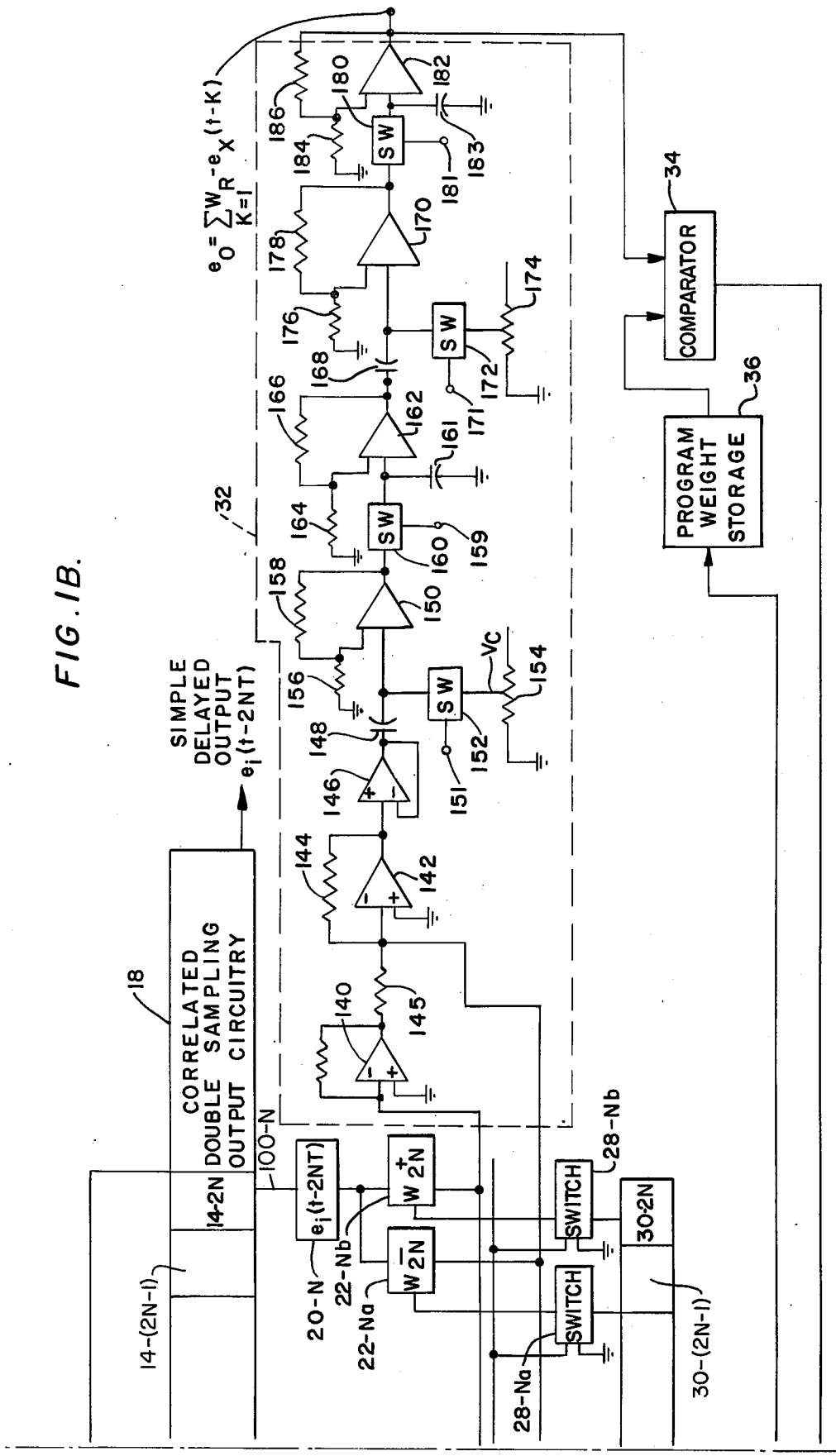

With regard to the drawings and in particular to FIGS. 1A and 1B, there is shown in diagrammatic form a discrete analog signal processing system in accordance with the teachings of this invention and comprising a charge transfer device illustratively taking the form of a charge coupled device 10 (CCD), acting as means for sampling an input signal and for transporting the sampled signal linearly therealong to be non-destructively read out at a plurality of output electrodes 100-2 to 100-N generally referred to by the numeral 100. As generally shown in FIG. 1 and more specifically depicted in FIG. 3, the input signal is injected into the CCD 10 by a stabilized charge injector 12, while suitable clock signals are provided from a CCD master clock circuit 11 to clock interconnections 16 for the shifting of the sampled input signal in the form of charge packets, including at least four phase signals $\phi_1$, $\phi_2$, $\phi_3$ and $\phi_4$, as shown specifically in FIGS. 5G to 5J. Reference is made to the above-identified application entitled "Discrete Analog Processing System Including a Matrix of Memory Elements" for a detailed disclosure of a suitable master clock circuit. The output as derived from the last stage is applied to a correlated double sampling output circuit 18. Circuit 18 is incorporated into the system of FIG. 1 for providing a test point for checking the operation of the CCD 10 and resembles the circuit as described in U.S. Pat. No. 3,781,574. Evenly-spaced outputs are taken by the output electrodes 100 from the CCD 10 as shown in FIG. 2A and applied through corresponding buffer circuits 20' to a pair of programmable weighting factor devices indicated generally by the numeral 22 and having a suffix indicating its corresponding tap. As will be explained in detail later, one of the weighting factor devices 22 associated with each output electrode 100 is interconnected to provide a positive (or real) weighting factor, while the other device 22 is interconnected to provide a negative (or imaginary) weighting factor. As shown in FIG. 2A, the output of each of the weighting factor devices, illustratively taking the form of MNOS devices, is connected respectively to one of a positive or a negative summing bus 24a and 24b, to be summed by an analog reconstruction circuit 32.

As seen in FIG. 1, groups of the stages of the CCD 10 are designated by the numeral 14 with a suffix indicative of the stage's number. For example, the second group of stages of the CCD 10 is designated with the suffix "2", while the corresponding output terminal 100 and weighting elements 22 are designated with a corresponding suffix "2". In this regard, the negative weighting factor device is designated with the numeral "22-2a" whereby the positive weighting factor device is designated with the numeral "22-2b". The remaining output electrodes 100 and weighting factor devices 22 are similarly designated.

Basically, the DASP system operates to multiply the programmable threshold voltage of the MNOS devices 22 with a CCD output obtained by non-destructive sensing via a floating clock sensor as will be explained with respect to FIG. 2B, or a surface potential sensing diffusion beneath a selected well of the CCD 10, as will now be explained with respect to FIGS. 1 and 2A. The output of the MNOS device 22 needs to be directly proportional to the product of the CCD signal and the weighting factor set by the MNOS threshold voltage $V_{TH}$, and must be capable of being summed with many other similar outputs. To achieve this last-mentioned requirement, the outputs should come from current sources and can be summed in an operational amplifier as shown in FIG. 1.

In particular, as shown in FIG. 2A, the output of the selected stage or well of the CCD 10 is applied to the gate of an FET 50 or 58 as shown in FIG. 2A. The CCD 10 is driven by four phase signals, and in one embodiment, the CCD output is sensed by a P+ diffusion region 78-2 disposed underneath the $\phi_1$ well of each group 14 to be tapped. As shown in FIGS. 2A and 3, the P+ diffusion region 78 is formed within a substrate 70 and within a particular layer 72 of silicon, beneath an electrode 92-2 to which the $\phi_1$ transfer signal is applied. As shown in FIG. 2A, the output electrode 100-2 is connected to the P+ region 78-2, whereby the charge stored in the well underneath the electrode 92-2 is sensed non-destructively to apply an output signal to the MOS FET 50. A similar output is derived from the P+ region 78-4 disposed beneath the $\phi_1$ electrode of the group 14-4 to provide an output to the MOS FET 58. As shown in FIGS. 2A and 3, each group 14 of stages or wells is formed of four such wells beneath the corresponding electrodes 92, 94, 96 and 98; as explained above, the aforementioned electrodes are designated with suffix numbers corresponding to that group of wells to which they belong. For example, the $\phi_1$ electrode of the first group is designated 92-1.

In order to realize DASP, the system must have the following characteristics:
1. a low-loss (approximately 1%), high dynamic range (greater than 60 cB), non-dispersive analog delay line with linearity (approximately 1%) in signal injection;
2. a non-destructive, sensing tap with analog multiplier or weighting, with accuracy of approximately 1% and linearity approximately of 1% in signal extraction; and
3. a method to compensate for offsets caused by voltage drift and bias errors.

The analog delay line loss and dispersive characteristics of the CCD 10 as described herein are determined by the transfer efficiency which has been measured to be less than $1(10^{-4})$ at a clocking frequency $f_c = 3$MHz, for six micrometer transfer electrodes and nine micrometer storage electrodes. As will be explained, the CCD 10 is a surface channel, four-phase, stepped-oxide with a 20% fat-zero in each CCD well. The input signal is injected as shown generally in FIG. 1 and more specifically in FIG. 3, and extracted as shown in FIG. 2A with approximately 1% linearity. As shown in FIGS. 2A and 3, the charges stored in the wells beneath the $\phi_1$ electrodes 92 are sensed through P-type diffusion regions 78 in one embodiment or via floating clock sensors in a second embodiment, and the voltage developed thereby is applied through the electrodes 100 to the buffer circuit 20' and in particular to the gate electrodes of the MOS FET's 50 and 58. Further, a biasing voltage $V_{DD}$ is applied to the drain of each of the MOS FET's 50 and 58, while the source electrodes thereof are biased by a constant current generator formed respectively by the MOS FET's 52 and 54. The source follower arrangement as shown in FIG. 2A transforms the high impedance associated with the P-type sensing diffusion regions 78 into a low-impedance voltage node indicated generally by the designation $V_L$. An inverting amplifier and source follower (current sink) transistor perform this function in the second embodiment, as explained with respect to FIG. 2B. Suitable biasing voltages $V_{GG}$ and $V_{BB}$ are applied, respectively, to the gate electrodes and to the source electrodes of the MOS FET's 52 and 54. The input signal may be injected and extracted (sensed) with approximately 1% linearity by the use of the MOS FET's 50 and 58 to be operated in their pentode region.

The non-destructive, reprogrammable weighting taps are achieved by the use of reprogrammable MNOS memory transistors 22, which in general provide an output $e_o(t)$ indicated by the following equation:

$$e_o(t) = \sum_{k=1}^{N} W_k e_i(t - kT) \quad (1)$$

where $W_k$ is the weighting function associated with the $k^{th}$ tap position and $e_i$ is the voltage signal as derived from the non-destructive sensing and buffering circuit 20'. In particular, the weighting factors are set in a plurality of programmable MNOS transistors 22, the outputs of which are summed upon the positive summing bus 24a or the negative summing bus 24b. In one embodiment as shown in FIG. 2A, the output voltage $V_{L2}$ as derived from the source of the MOS FET 50 indicative of that voltage sensed beneath the $\phi_1$ electrode of group 14-2, is applied to the drain of each of a first or positive weighting factor MNOS transistor 22-2b and a second or negative weighting MNOS transistor 22-2a; the transistors 22-2b and 22-2a are respectively connected to the positive and negative buses 24a and 24b. As will be explained a variable weighting factor is programmed into one of the transistors 22-2a and 22-2b to provide the desired negative or positive weighting factor to be multiplied by the sampled and delayed signal derived from the electrode 100-2. In summary, the reprogrammable MNOS transistors 22, as operated in their linear triode region, connects the voltage node $V_L$ to one of the summing points or bars 24a or 24b, thereby providing an output signal current $I_M$ directly proportional to the product of the MNOS programmable weight and $V_L$, the CCD surface potential as transformed by a "unity gain" source follower as provided by the MOS FET's 50 and 58, in accordance with the following equation:

$$I_M = -g_{ds_M} \cdot V_L \text{ where } g_{ds_M} = \mu C_M \left(\frac{W}{L}\right) Q_M \cdot (V_R - V_{TH}), \quad (2)$$

where:
$V_R$ is the common memory gate voltage,
$C_M$ is the capacitance of the memory multiplier transistor,
$(W/L)Q_M$ is the effective ratio of the width to length of the multiplier memory transistor, and
$\mu$ is the minority carrier mobility of substrate 72.

The weighted output as applied to one of the summing bars 24a or 24b by the MNOS transistors 22 possesses a linearity limited only by that of the MNOS transistors 22, when operated as a fixed conductance. Any geometric or other variances arising due to manufacturing processes are compensated via the tap weighting programming and calibrating procedure, as will be explained. In a similar manner, the voltage as developed at the node $V_{L4}$ coupled to the source of the MOS FET 58 is applied to the drain electrodes of the programmable MNOS transistors 22-4a and 22-4b to provide an output as applied to the positive and negative summing bars 24a and 24b according to the product of the weighting factor set into one of the transistors 22-4a or 22-4b and the surface potential sensed at the diffusion region 78.

Figure 7B:
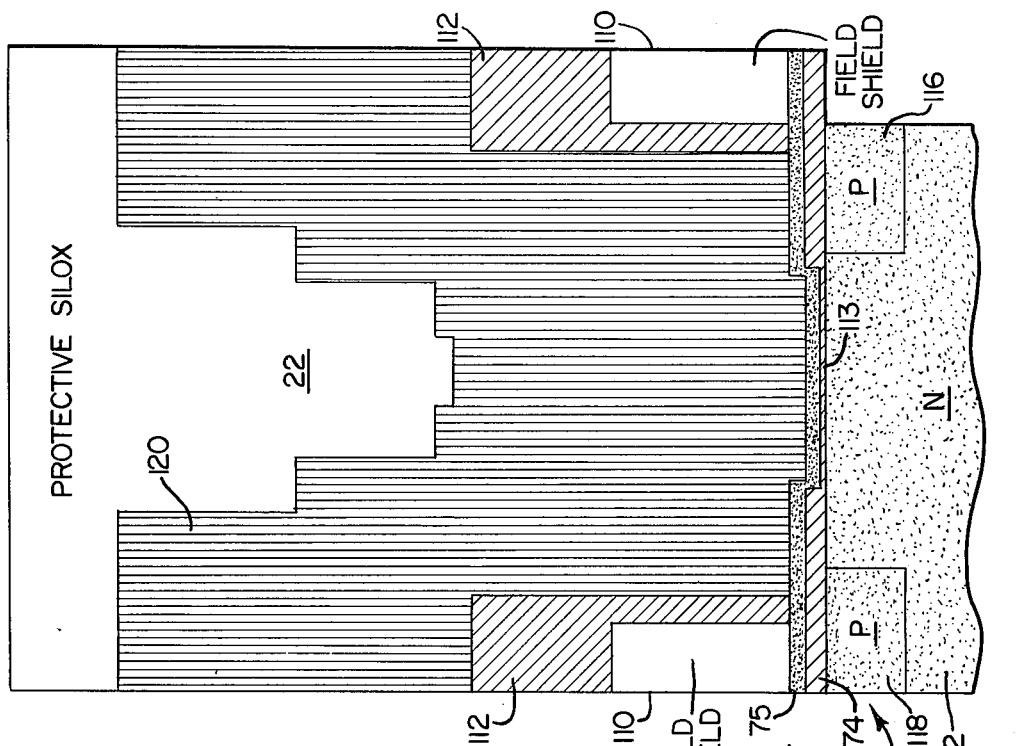
FIGS. 7A and 7B show, respectively, detailed cross-sectional views of the semiconductive assembly of FIG. 6, showing, respectively, the CCD and MNOS devices.

The operation of the MNOS transistors 22 in their three modes, ERASE or CLEAR, WRITE or READ, will now be explained in detail with respect to FIG. 2A. The ERASE mode is effected by applying to the substrate a negative voltage relative to the gate of the MNOS transistors 22, whereby the MNOS transistors 22 acting as a memory are disposed in their low threshold state. As shown in FIG. 2A, a negative voltage $V_{EP}$ is applied to the substrate of the transistors 22, in the order of $-20V$, while applying a voltage $V_R$ of 0V to the gate, a voltage in the order of $-20V$ through the positive and negative bars 24a and 24b to the sources of the MNOS transistors 22, and a voltage in the order of $-20V$ to the drains of the MNOS transistors 22. As will be explained later, the voltage $V_L$ appearing at the drains of the transistors 22 is developed by applying a test voltage to the CCD 10 and advancing it from well to well, whereby a potential in the order of 5V to 15V is developed at the electrodes 100 and a corresponding voltage is developed at the node $V_L$ and the drains of the transistors 22. For the illustrative embodiment of this invention wherein the MNOS transistors 22 are formed as shown in FIG. 7B with P-type drain and source regions 118 and 116 formed within an N-type silicon substrate 72 covered by a first layer 74 of silicon oxide and a second layer 75 thereover of silicon nitride, positive charges are established at the interface of the silicon oxide layer 74 and the silicon nitride layer 75. In order to ERASE (or CLEAR), the MNOS transistors 22 are set to their low threshold voltage state by, in effect, applying a positive voltage to the gate electrode thereof, whereby the positive interface charges are driven or tunneled through the silicon oxide layer 74 into the silicon substrate 72. The threshold voltage when the MNOS transistor 22 has been cleared, is in the order of 2V.

In the WRITE mode, the programmed weighting constants $W_k$ are set or written into the MNOS transistors 22 by raising their threshold voltage $V_{TH}$ to a value corresponding to the programmed weighting constant. In the WRITE mode, the voltage $V_{EP}$ coupled to the substrates of the MNOS transistors 22, and the voltages applied to the sources and drains thereof are placed at zero, while the voltage $V_R$ coupled to the gate electrodes of the MNOS transistors 22 is varied in accordance with the desired weighting factor $W_k$ between values of zero and $-20V$, whereby the threshold voltage $V_{Th}$ is selectively set between a low threshold value of 2V and a high threshold value of 12V.

After the DASP system as shown in FIG. 1 has been programmed with the desired weights $W_k$ set into each of the MNOS transistors 22, an input signal is applied to the CCD 10 to be sampled and shifted through each of the wells or stages thereof to provide outputs at the electrodes 100. As shown in the embodiment of FIGS. 2A and 3, the CCD outputs are sensed through the P+ region 78 and applied to the MNOS transistors 22; the outputs of transistors 22 are indicative of the product of the sampled and delayed input signal and the weighting factor $W_k$. During the normal operation of the DASP system as shown in FIG. 1, the MNOS transistors 22 are operated in their READ mode, wherein the voltage $V_R$ as applied to the gate electrodes of the MNOS transistors 22, is set in the range of $-6V$ and $-12V$ relative to the substrate 70, and the voltage $V_L$ as applied to the drain of the MNOS transistors 22 is the delayed and sampled output of the CCD 10 according to the input signal applied to the stabilized charge injector 12. In the READ mode, the substrate voltage $V_{EP}$ is set at 0V. The output signal derived from the MNOS transistors 22 is applied as shown in FIGS. 1 and 2A to the positive and negative summing bars 24a and 24b to be summed together by an analog reconstruction circuit 32 (see FIG. 1B), as will be explained.

As more fully discussed in an article entitled, "An Electrically Programmable LSI Transversal Filter For Discrete Analog Signal Processing (DASP)", appearing in Proceedings of CCD Applications Conference, San Diego, Sept. 18–20 1973, pp. 111–126, by the inventors of this invention, the conductance of the MNOS transistors 22 in terms of their memory current versus drain-to-source voltage is dependent upon the length and number of pulses applied to the gate electrode during the WRITE or programming mode of operation of the MNOS transistors 22. Thus, in one embodiment of this invention, it is contemplated that single pulses of selected amplitude in the order of 15V to 25V and of selected duration in the range of 1$\mu$sec to 10$\mu$sec are applied to the gate electrodes of the MNOS transistors 22 to effect the desired shift in the threshold voltage $V_{TH}$. A pulse of a duration of 10$\mu$sec and an amplitude of $-20V$ will shift the threshold voltage of the MNOS transistors 22 from their low threshold voltage $V_{TH}$ in the order of $-1.5V$ to a high threshold voltage $V_{TH}$ in the order of $-8.8V$.

Figure 9A:
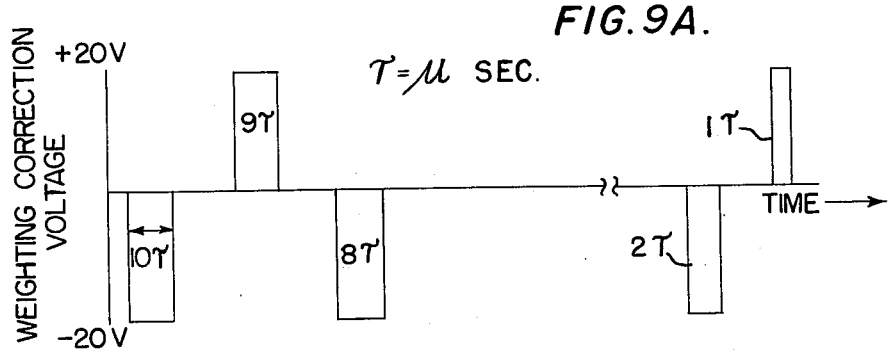
FIGS. 9A and 9B show bursts of weight corrective voltage signals for effecting an increase and decrease, respectively, in the threshold voltages of the MNOS devices of FIG. 1.
Figure 9B:
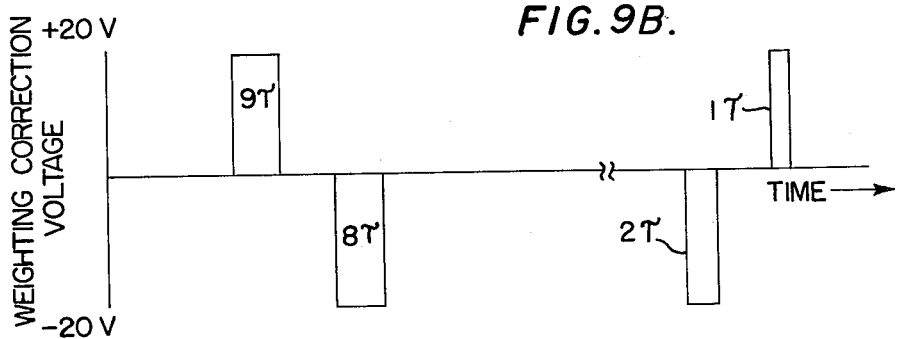

In an alternative mode of operating the MNOS transistors 22, a bipolar pulse train of selected height and variable duty ratio is applied to the gate electrodes of the MNOS trnsistors 22 to effect the desired shift, i.e., to either increase or decrease the threshold voltage $V_{TH}$ of the MNOS transistors 22. As shown in FIG. 9A, a variable duty train of pulses beginning with a negative-going pulse of a duration of 10$\tau$ and terminating with a positive-going pulse of 1$\tau$, where $\tau$ is in the order of 1$\mu$sec and the pulse amplitude is approximately 15V to 20V, is applied to the MNOS transistor gates to effect an increase of the threshold voltage. The sum of the variable duty pulse train as shown in FIG. 9A is negative, thus increasing the number of charges at the silicon oxide/silicon nitride interface of the MNOS transistor 22, and thereby increasing its threshold voltage $V_{TH}$. By contrast, FIG. 9B shows a variable duty train of pulses beginning with a positive-going pulse of 9$\tau$ width and terminating with a positive-going pulse of 1$\tau$ width; as a result, the sum of the bipolar signals is positive, thereby tending to tunnel the positive interface charges into the silicon substrate so that the MNOS transistor threshold voltage $V_{TH}$ is reduced. As discussed in the above-noted article, measurements have been made upon MNOS transistors to test their memory characteristics and to demonstrate that after an initial period of 20 minutes and even after 100,000 minutes of storage, the conductance drift is relatively small. Significantly, the drift deviation was improved by writing or programming with variable pulse trains as shown in FIGS. 9A and 9B.

Figure 8A:
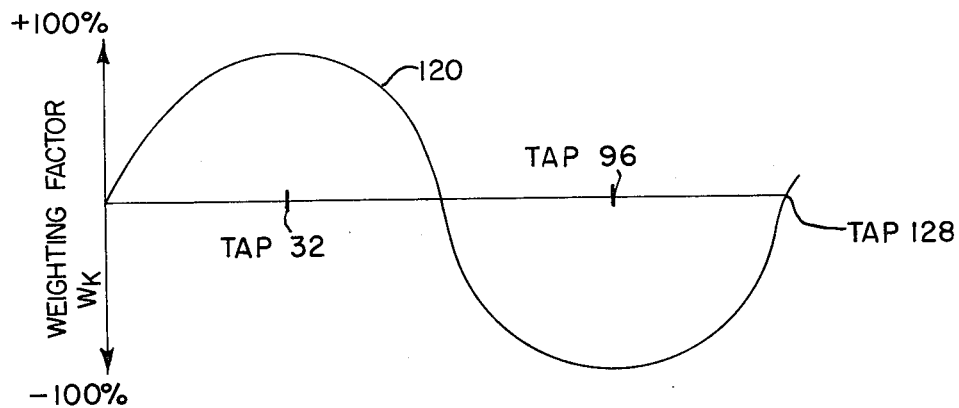
FIGS. 8A and 8B show, respectively, in graphic form a sinusoidal curve representative of the desired weighting factors to be programmed into the MNOS devices as shown in FIG. 1 and the outputs of the system of FIG. 1 to be compared with the desired weighting factors, whereby a corrective output may be derived.

One of the significant advantages of this invention results from the ability to program the MNOS transistors 22 to provide system outputs in accordance with a variety of processing functions such as Doppler filtering, discrete Fourier transform, post-detection integration, and various correlation functions including linear FM and biphase coded pulse modulation. In an illustrative embodiment of this invention, the MNOS transistors 22 are programmed in accordance with a sinusoidal curve as shown in FIG. 8A, whereby the DASP system of FIG. 1 operates as a transversal filter to provide an output indicative of receiving an input signal of desired frequency. As shown in FIG. 8A, a weighting factor varying between +100% and −100% is set into the MNOS transistors 22 in accordance with their tap position along the length of the CCD 10. For example, at tap 32 of the 128-tap CCD 10, $W_{32}$ is set at +100%; whereas at tap 96, $W_{96}$ is set at −100%. As explained above, two MNOS transistors 22 are provided for each electrode 100 or tap position, whereby negative and positive weighting factors may be applied to the output derived from each tap. Thus, at tap position 32, MNOS transistor 22-32a is set to its lowest threshold value in the order of 2V, and at tap position 96, MNOS transistor 22-96a is set to a high threshold value approaching 10V. Further, at tap 96, the MNOS transistor 22-96b is programmed to have a weighting factor of −100%, i.e., it is set to a threshold voltage of 2V. As indicated in FIG. 1, the MNOS transistors having a suffix $a$ are programmed to provide negative weighting factors and are connected to the negative summing bar 24b, whereas those transistors 22 with suffixed $b$ are programmed to have positive weighting factors and are coupled to the positive summing bar 24a to be subtracted by the analog reconstruction circuit 32 from the signals applied to the summing bar 24b.

In order to program the MNOS translators 22 as incorporated into the DASP system of FIG. 1, the programmed weighting constants as stored in a program weight storage 36, illustratively taking the form of a PMOS silicon gate ROM as manufactured by Signetics, Inc. under the model designation No. 2580, are read out sequentially to set the threshold value of the MNOS transistors 22 during the WRITE mode. Initially, each of the MNOS transistors 22 may be cleared, thereby being set to its low threshold voltage state. As the weighting factors are read out sequentially from the storage 36, they are applied to a comparator circuit 34 whose output is indicative of the difference between the reference value of the weighting factor derived from the storage 36 and the measured value thereof derived from the analog reconstruction circuit 32. The comparator output is applied to the read control circuit 38, which serves to actuate a switch 44, whereby the output of a programming pulse generator 48 is applied along write bus 26 to the gate of each of the MNOS transistors 22 in sequence. Further, the output of the comparator 34 is also applied to the programming pulse generator 48, whereby the amplitude (or duration) of the pulse applied to the gate of the MNOS transistor to be programmed is controlled in accordance with the weighting factor stored in the storage 36. In order to synchronize the read-out of the weighting factors from the storage 36 in accordance with the writing of the selected MNOS transistor 22, the program weight read control circuit 38 actuates a timing pulse generator 42 to generate a single output pulse, during the PROGRAM mode of operation, to be applied to a static control register 30, illustratively taking the form of an 8-bit parallel output shift register as manufactured by Signetics, Inc. or Texas Instruments under the designation No. N74164, and also to a clock circuit 46 for generating and applying $\phi_1$ and $\phi_2$ clock signals to the register 30, whereby the single pulse is sequentially shifted from one stage to the next in synchronism with the programming of the individual weighting factors $W_k$ according to the data stored in the storage 36. As indicated in FIG. 1, the program weight read control circuit 38 and the CCD master clock circuit 11 are interconnected to ensure synchronism in their operations. The output taps of the static register 30 are connected as shown in FIG. 1 to corresponding switches indicated generally by the numeral 28, whose suffix corresponds to that of the MNOS transistor 22 connected thereto. For example, switch 28-2a actuated in response to the output of stage 30-1 of the register 30, controls the input as applied along write line 26 to the gate of transistor 22-2a. Thus, as the synchronizing pulse, as derived from the timing pulse generator 42, is transferred to the first stage 30-1, its output actuates switch 22-2a to pass the write pulse or train of pulses (as shown in FIGS. 9A and 9B) to the gate of the MNOS transistor 22-2a to write a weighting factor in accordance with that derived from the first storage position of the storage 36.

In similar manner, the program weight read control circuit 38 initiates the operation of a test pulse generator 51 to apply a calibration test pulse through the stabilized charge injector 12 into the CCD 10 to be shifted from stage (or well) to stage under the influence of the four-phase clock inputs. The four-phase clock inputs serve to shift the test pulse from stage to stage, whereby a known output is derived sequentially from the electrodes 100 in synchronism with the calibration test pulse propagating along the CCD 10, while the READ voltage as derived from the generator 49 and the switches 44 and 28 is applied to the gates of all MNOS memory devices 22. Thus, a single test pulse is shifted through the stages of the CCD 10 so that an appropriate voltage is developed at the node $V_L$ (as shown in FIG. 2A) and is applied to the drain of the corresponding MNOS transistor 22 at the same time that a READ pulse of the appropriate amplitude is applied to the gate electrode of that MNOS transistor 22, whereby its conductance is set in accordance with the coded weighting factor.

As mentioned above, one of the requirements for DASP is an accurate analog multiplier such as provided by the electrically reprogrammable, i.e., electrically alterable, non-volatile MNOS transistors 22. One problem in achieving an accurate setting of the MNOS conductances results from random variations of either the CCD register tap gains or that the reference signal conductance matrix produces side lobes in the filter bank. These errors add generally in a non-coherent manner and the effect of individual error is reduced by the correlation gain of the conductance matrix of the MNOS transistors. For example, if the rms gain variation of individual conductances is 3%, and the correlation gain is 20dB, then the average filter side lobes (for filters far away from the signal frequency) will be 50dB down. However, for certain combinations of signal frequencies and filters, the individual errors will add nearly coherently. Thus, the peak side lobe will lie only about 30dB down. However, a 3% rms overall accuracy appears to be difficult to achieve using a weighting or conductance setting operation on an open loop basis. Therefore, as will now be explained, a reiterative procedure is used to electrically set the weighting factors, e.g., adjusting the threshold value or conductance of the corresponding MNOS transistors 22. In general, each of the MNOS transistors 22 is set to a nominal conductance value by setting its threshold voltage, as explained above, and thereafter adjusting to the desired value using either a single correction pulse or burst of pulses as derived from the programming pulse generator 48 under the control of a difference or correction signal derived from the comparator 34 indicative of the difference between the measured output of the DASP system as derived form the analog reconstruction circuit 32 and a reference value as derived from the program weight storage 36.

Figure 8B:
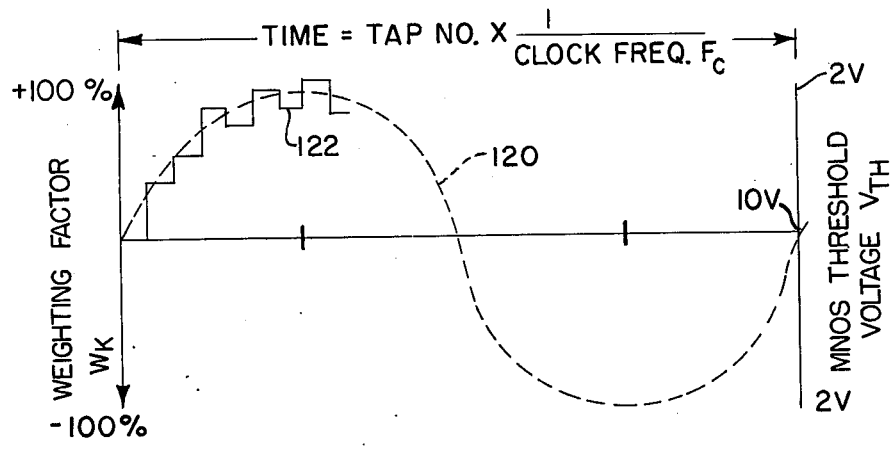

With reference to FIG. 1, a reiterative programming mode of operation is conducted after the initial setting of the weighting factors into the MNOS transistors 22 under the control of the program weight read control circuitry 38 which actuates the timing pulse generator 42 to generate a series of "one" signals filling register 30 with command signals to close all switches 28 and switch 44 to connect READ voltage 49 to bus 26, and the test pulse generator 51 to apply a single test pulse to the CCD 10 to be advanced from stage to stage along the length thereof. As a result, all of the MNOS transistors 22 are simultaneously actuated and the test pulse is applied sequentially to each of the MNOS transistors 22 to read out a signal dependent upon the previously-set threshold voltage, which output is applied to the positive and negative summing bars 24a and 24b to provide a series of output signals from the analog reconstruction circuit 32 indicative of the conductance of each of the serially samples MNOS multiplying transistors 22. In turn, the output of the analog reconstruction circuit 32 is applied to the comparator 34 which provides an output indicative of the difference of the desired weighting factor as stored in the program weight storage 36 and the measured or sensed value of conductance as previously set in the selected MNOS transistor 22. FIG. 8B shows a curve 120 (dotted line) indicating the desired value of the weighting factor as a function of the tap position of the CCD 10, and also the value of the weighting factor as read out from the analog reconstruction circuit 32, in the form of the curve marked with the numeral 122. The difference between the curves 120 and 122 at each tap position, corresponding to a selected pair of MNOS transistors 22a and b, is derived from the comparator 34. The comparator output is applied to the program read control circuit 38 and to the programming pulse generator 48. The generator 48 responds to the difference signal to generate a pulse or series of pulses (see FIGS. 9A and 9B) to effect either an increase or a decrease of the threshold voltage. The switch 44 is shifted under the control of the circuit 38 to apply the generator output along the bar 26 to the selected one MNOS transistor 22 (as determined by its actuated switch 28) to adjust its threshold voltage in accordance with the error or difference signal derived from the comparator 34. This process is repeated a number of times until the weighting factor as set into each of the MNOS transistors 22 is within an acceptable tolerance, e.g. 1%, of the reference weighting factor stored in the program weight storage 36.

As mentioned above, one of the requirements for DASP is that the analog delay line has a linearity of approximately 1% in signal injection. Signal injection is explained with respect to FIG. 3 and FIGS. 4A, 4B, 4C and 4D. In FIG. 3, a cross-section of that portion of the semiconductive substrate 72 shows generally the structure of the CCD 10, whereas FIGS. 4A to 4D show the charge distribution within corresponding portions of the silicon substrate layer 72. In FIG. 3, a P+ type source region 76 is formed within the substrate 72 and a source contact 80 is formed through a window within the silicon dioxide layer 74 and the silicon nitride layer 75 in direct contact with the region 76. Linearity of signal injection is achieved primarily through the use of the additional electrodes 80, 82, 84, 86 and 88, to which the biasing potentials V+, $V_H$ and V− are applied. Generally, the voltage signals V+ and V− as shown in FIGS. 5C and 5D, respectively establish a charge distribution as seen in FIGS. 4A to 4D within the silicon substrate layer 72. In particular, the input signal is applied to either the V+ electrode 82 or the V− electrode 86, for the control of the injection of the charge packets into the first and subsequent wells of the CCD 10. $\phi_{1A}$ and $\phi_{1B}$ electrodes 90 and 91 are provided to facilitate the injection of the large amounts of charge needed for the maximum allowable propagating charge packet, $Q_{MAX}$. The injected charge then is transferred successively beneath the $\phi_1$, $\phi_2$, $\phi_3$ and $\phi_4$ electrodes 92, 94, 96 and 98 of the successive groups 14 to be transferred along the length of CCD 10. The various signals as applied to the electrodes of the stabilized charge injector 12 as well as the shift register portion of the CCD 10 are shown in FIGS. 5A to 5J.

Figure 4A:
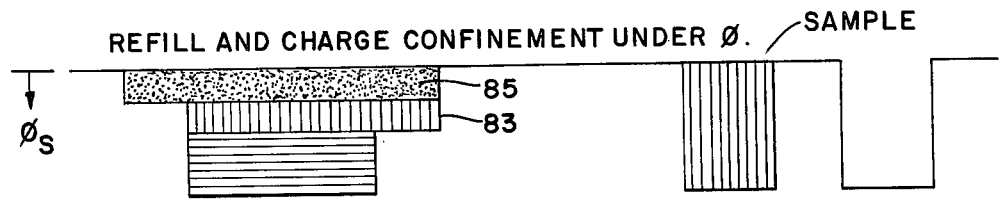
FIGS. 4A, 4B, 4C and 4D are graphic representations of the injection charges along the silicon-silicon dioxide interface of the CCD shown in FIG. 3.
Figure 5A:
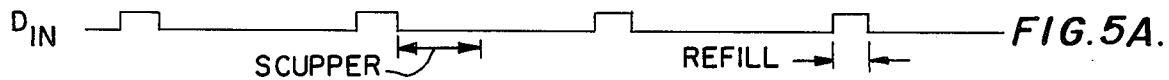
FIGS. 5A to 5K, and 5L to 5O show, respectively, the signals appearing at the electrodes of the CCD device shown in FIG. 3, and the pulse control signals applied to the reconstruction circuit of FIG. 1.

The first or refill step of injecting the signal into the CCD 10 as shown in FIGS. 4A and 5A is carried out by pulsing the source electrode 80 to the potential of the substrate 72. During the refill phase as shown in FIG. 4A, the charge uncertainty is limited by the following equation:

$$q_n{}^2 = kT(C_+ + C_H + C_-) \quad (3)$$

Figure 4B:
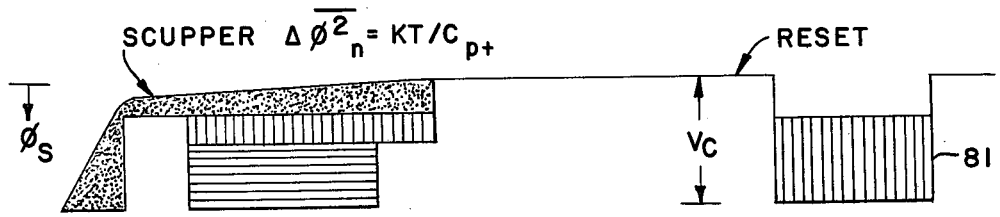

These charge fluctuations are meaningless since in the next step as shown in FIG. 4B, the minority carriers near that charge level are drained or "scuppered" from the upper part 85 of the well established beneath the electrodes 84 and 86 back into the source diffusion region 76, which now is reverse-biased, until the charge level within the well 83 underneath the electrodes 84 and 86 reaches the voltage level as applied to the V+ gate electrode 82. In other words, all of the excess charges including those which give rise to the population variation or randomness as expressed in equation (3), are scuppered into the drain region 78 until the surface potential at the $V_H$ and V− electrodes 84 and 86 equals the surface potential underneath the V+ electrode 82, which has noise fluctuations given by the equation:

$$\overline{\Delta\phi n^2} = kT/C_{P+} \quad (4)$$

where $C_{P+}$, $C_{P-}$ and $C_{PH}$ equal the total on-chip plus off-chip capacitances at the nodes associated with the V+ electrode 82, the V− electrode 86 and the $V_H$ electrode 84, respectively.

As seen in FIGS. 3 and 5A, the source diffusion 76 is biased by the voltage applied to the electrode 80, whereby all the minority carriers near the charge level as given in the equation (3) within the well formed beneath the electrodes 82, 84 and 86 as shown in FIG. 4B, are drained or "scuppered" back into the diffusion region 76. At the end of the "scupper" process, the excess or random charges have been removed from this uppermost part 85 of the well beneath the electrodes 82, 84 and 86.

Figure 4C:
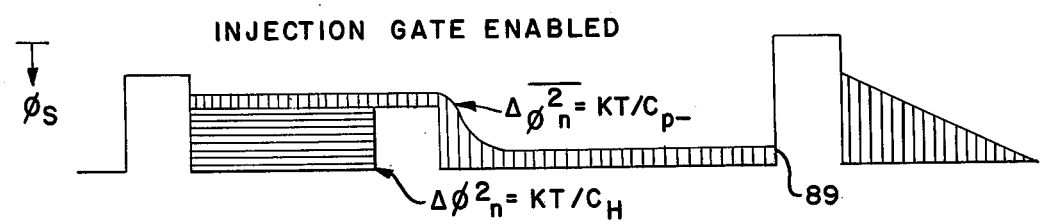
Figure 5B:
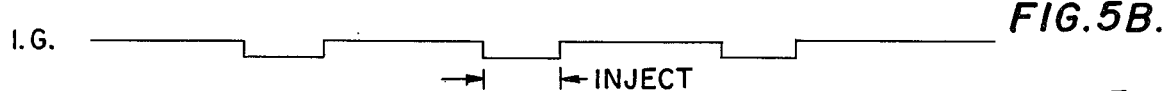
Figure 5C:
Figure 5D:
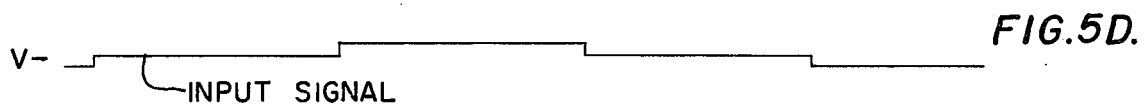

Next, the injection gate is enabled by applying a negative-going inject pulse IG as shown in FIG. 5B to the injection gate electrode 88, whereby positive charges are permitted to flow into the first receiving well 88 as shown in FIG. 4C, beneath the $I_G$ electrode 83, the $\phi_{1A}$ electrode 90 and $\phi_{1B}$ electrode 91, and $\phi_1$ electrode 92-1. The minority carriers continue to flow until the surface potential beneath the $V_H$ electrode 84 equals the surface potential beneath the V− electrode 86, which has a potential noise fluctuation in accordance with the equation:

$$\overline{\Delta\phi_n{}^2} = kT/C_{P-} \quad (5)$$

Electrode 84 may be electrically connected to electrode 86 or an independent negative voltage may be applied to electrode 84 to establish a depletion region which acts as a minority carrier holding well 93. During this injection period, any potential fluctuation on the $V_H$ electrode 84 injects undesired charge randomness given by the equation:

$$q_n = C_H \cdot \Delta\phi_n, \text{ where } \overline{\Delta\phi_n{}^2} = kT/C_{PH} \quad (6)$$

The input signal as shown in FIG. 5D may be applied to either the V+ electrode 82 or the V− electrode 86 whereby the quantity of charges permitted to flow into the well 89 is controlled as shown in FIG. 4C. Further, equations (4), (5) and (6) as given above may be expressed as follows:

$$Q_{SIG} = (C_H + C_-)(V_+ - V_-) \quad (7)$$

and $$q_n{}^2 = (C_H + C_-)^2 \cdot (kT/C_{P+}) + (C_H + C_-)^2 \cdot (kT/C_{P-}) + C_H{}^2 \cdot (kT/C_{PH}) \quad (8)$$

or $$q_n{}^2 \cong (C_H + C_-)^2 \cdot kT \cdot (C_{P+}{}^{-1} + C_{P-}{}^{-1} + C_{PH}{}^{-1}) \quad (9)$$

The last factor of equation (9) is simply the equivalent series combination of the total off-chip parasitic and on-chip capacitance at the V+ electrode 82, $V_H$ electrode 84 and V− electrode 86, which may be expressed by the term $C_P$, permitting the following equation:

$$q_n \cong (C_H + C_-) \cdot (kT/C_P)^{1/2} \quad (10)$$

Figure 5E:
Figure 5F:

In FIG. 3, there is shown $\phi_{1A}$ and $\phi_{1B}$ electrodes 90 and 91 which facilitate the injection of large amounts of charge into the well 89 therebeneath to permit the maximum allowable propagating charge packet $Q_{MAX}$. As seen in FIGS. 5E and 5F, negative-going pulses are applied to the electrodes 90 and 91 during the injection step, whereby a maximum amount of charges is disposed in the well 89. If $V_C$ denotes the surface potential differences generated by the clock signals $\phi_1$ to $\phi_4$ and $V^1$ indicates the surface potential when $Q_{MAX}$ is disposed within the well 89 underneath electrodes 91 and 92, the following relationship is obtained:

$$Q_{MAX} = C_1 \cdot V_C = (C_H + C_-)(V_+ - V_-) = (C_{1A} + C_1) \cdot (V_C - V^1) \quad (11)$$

Figure 4D:
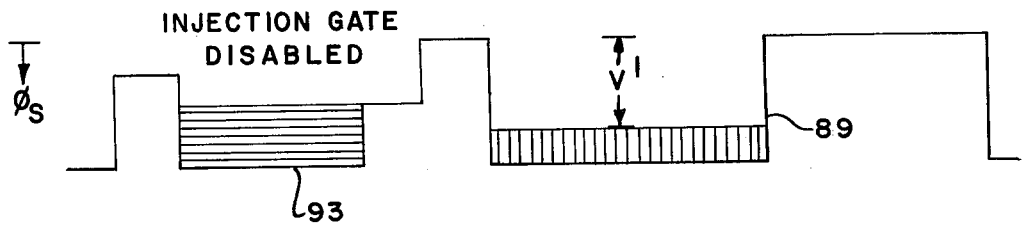

In the final step of operation as shown in FIG. 4D, the injection gate is disabled when the injection gate signal as shown in FIG. 5B returns to a more positive level, thereby raising a barrier across which the charges do not flow back into the holding well 93 beneath the electrode 84; if the charges were permitted to flow back, an extra uncertainty would be introduced into the signal processing. The barrier potential must rise slowly compared to the speed of charge flow forward into the receiving well 89. To help this forward flow of charges, the effective drain potential $V^1$, must be kept sufficiently below the effective source potential $V-$ to provide the desired longitudinal drift fields from moving the charge forward in accordance with the following equation:

$$(V_+ - V_-) - V^1 > V_{MIN} \qquad (12)$$

From equation (11) and (12), the capacitances are selected and thereby the area of the corresponding electrodes in the formation of the integrated circuit.

From equations (7) and (11), it is seen that the amount of charge injected is linearly related to the input signal voltage $V-$ as shown in FIG. 5D by the factor of the capacitances $(C_H + C_-)$. Since these capacitances are essentially determined by the characteristics of the silicon dioxide layer 74 and the silicon nitride layer 75, they are independent of the charge storage potential applied, giving the desired signal-voltage-to-injected-charge linearity to thereby meet one of the requirements for DASP.

After the charge packet has been transferred into the well beneath the $\phi_1$ electrode 92-1 of the first cell 14-1, the charge packet is transferred from well to well along the linear length of the CCD 10 under control of the phase clock signals $\phi_1$, $\phi_2$, $\phi_3$ and $\phi_4$, as shown respectively in FIGS. 5G to 5J. It is understood that the $\phi_1$, $\phi_2$, $\phi_3$ and $\phi_4$ clock signals are applied to the corresponding electrodes 92, 94, 96 and 98 of each of cells 14 of the CCD 10. Generally, the charge packet is transferred from well to well by an attractive voltage (shown in the waveforms of FIGS. 5G to 5J as a relatively low amplitude) applied to the next electrode, and thereafter applying a repulsive voltage (shown in the voltage waveforms as a relatively high amplitude) to the well from which the minority charge carriers are attracted. The transfer of the charge carriers from well to well is generally shown in FIGS. 5G to 5J by arrows indicating that the carriers are transferred to the well beneath that electrode to which the corresponding phase clock signal is applied; the charge packet is further transferred from the well underneath the $\phi_4$ electrode of one cell to the well beneath the $\phi_1$ electrode of the next, successive cell 14.

More particularly, in the SAMPLE step as shown in FIG. 4A, an attracting voltage is applied to the $\phi_1$ electrode 92, while a repulsive voltage is applied to the $\phi_2$ electrode 94, the $\phi_{1B}$ electrode 91, and the $\phi_4$ electrode 98, whereby the charge packet is confined to a well beneath the $\phi_3$ electrode 96. Next, in the CHARGE ADVANCE step, the charge packet is moved from the well beneath the $\phi_1$ electrode 92 to a well formed beneath the $\phi_2$ electrode 94 and the $\phi_3$ electrode 96. In particular, negative or attracting pulses are applied to the $\phi_2$ electrode 94 and the $\phi_3$ electrode 96, while repulsive voltages are applied to the remaining electrodes 92 and 98 to deposit the charge packet into an expanded well beneath the electrodes 94 and 96.

Figure 5G:
Figure 5H:
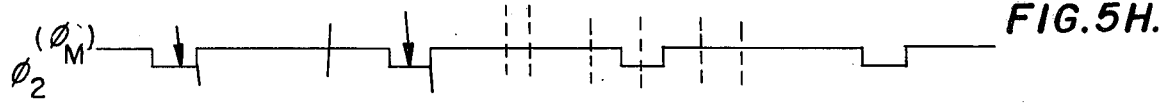
Figure 5I:
Figure 5J:
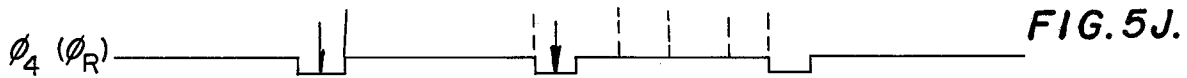
Figure 5K:
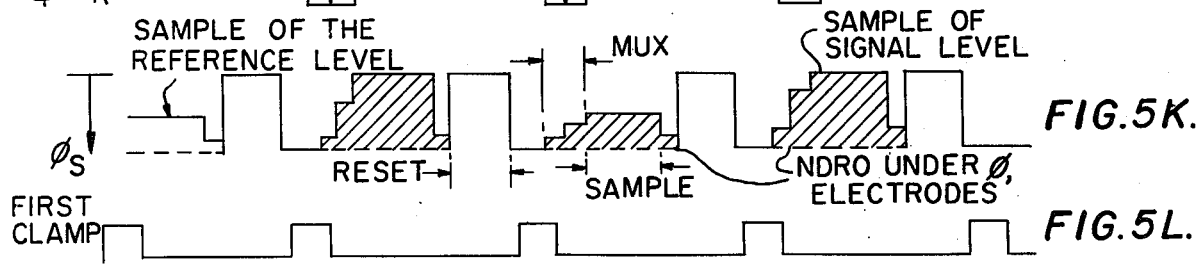

In the RESET step as shown in FIGS. 4B, 5G and 5K, the charges are further transferred one step along the length of the CCD 10, and the region beneath the $\phi_2$ electrode 94 is cleared by applying a repulsing voltage to the $\phi_2$ electrode 94, while applying an attracting voltage to the $\phi_3$ electrode 96. Next, in the CLAMP step as shown in FIGS. 5G and 5K, the charges are confined to a well beneath the $\phi_3$ electrode 96 and an empty well is established beneath the $\phi_1$ electrode 92 by applying attracting voltages to the $\phi_1$ electrode 92 and the $\phi_3$ electrode 96, while applying repulsing voltages to the remaining electrodes 94 and 98. In this manner, the charge packets are moved sequentially along the length of the CCD 10 to be sensed as explained above.

In order to ensure the desired linearity and accuracy for DASP, errors in the output signals due to drifting of the biasing sources must be compensated for. As shown in FIG. 2A, only every other cell 14 of the CCD 10 is tapped and a bipolar input signal biased to a signal reference level is applied to a multiplexer 199 (see FIG. 1) for sequentially sampling the input signal and applying a sampling thereof to the stabilized charge injector 12 and thereafter applying a zero reference voltage of an amplitude corresponding to the zero reference level of the input signal. An indicated in FIG. 1, the multiplexing operations of circuit 199 are coordinated with the propagation of the charge packets along the length of the CCD 10 by the CCD master clock circuit 11. By such multiplexing, any drift in the DC bias may be readily detected and compensated for within the analog reconstruction circuit 32. As explained in detail in U.S. Pat. No. 3,781,574, a process is described by which the reset noise due to an potential fluctuations including Nyquist noise, when the well attractive to signal carriers is re-established, may be compensated for by detecting a voltage corresponding to that of the reset noise and subtracting it from the signal to be read out thereby to eliminate the reset noise errors present in the CCD. Thus, during the CLAMP step as explained above, the reset noise voltage is sensed and is stored within the analog reconstruction circuit 32 to be subtracted from a subsequent value (for the input signal plus reset noise). In particular, an empty well is shifted beneath the $\phi_1$ electrodes 92 and the corresponding reset error voltage is read out upon the electrode 100 to be processed by the circuit 32.

The output signals as derived from the wells beneath the $\phi_1$ electrodes 92 are read out and multiplied by the weighting factors stored upon the corresponding MNOS FET's 22, and are summed on the positive and negative bus bars 24A and 24B. As seen in FIG. 1, the summed outputs upon the bars 24a and 24b are respectively applied to the analog reconstruction circuit inputs of current-to-voltage amplifiers 140 and 142.

Figure 5L:
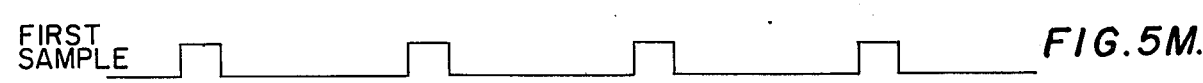

The reconstruction circuit inputs as derived from bars 24a and 24b are applied to be summed, sampled and stored, thus removing the reset noise of the CCD's, and to readjust the zero reference level of the signal. In particular, the output of the amplifier 140 is applied through resistive element 145 to an operational amplifier 142 having a resistive element 144 connected between its output and input, while the output line 24b is applied to the input of operational amplifier 142, the output of which is coupled to its input through a resistive element 144. The operational amplifiers 140 and 142 serve to sum the outputs applied to the positive and negative bus bars 24a and 24b, whereby the signals applied to the bus bar 24b are subtracted from those applied to the bus bar 24a, while maintaining the bus bars 24a and 24b at a predetermined DC voltage. Such an output is applied by a preamplifier stage comprising an operational amplifier 146, to a first or "clamp" capacitor 148 whose output is coupled to the electrically-controlled switch device 152, which may be, for example, a MOS switch. The switch 152 couples the capacitor 148 to a negative reference voltage $V_C$, which is established upon a potentiometer 154 and which acts as a clamping voltage or DC restore voltage for the capacitor 148. The switch device 152 is adapted to be opened and closed in accordance with a synchronized first clamping signal as depicted in FIG. 5L, applied to its terminal 151. In turn, the common point between capacitor 148 and switch 152 is connected to the high impedance input of an operational amplifier 150, while its other input is connected to a reference voltage. Additionally, the operational amplifier 150 has a feedback network including resistive elements 158 and 156 coupled from the output of the operational amplifier 150 to the second-mentioned input. The output of the operational amplifier 150 is applied to a second electrically-controlled switch 160, which is opened and closed under the control of a first sample signal (see FIG. 5M) applied to its terminal 159; the switch 160 may, for example, comprise a MOS switch device. The switching device 160 is coupled through a second or "sample" capacitor 161 to ground. The point of interconnection between the capacitor 161 and the switch 160 is connected to the high impedance input of an operational amplifier 162, which has a feedback network including the resistive elements 166 and 164.

In turn, the output of the operational amplifier 162 is coupled to a third or "clamp" capacitor 168, which is selectively set to a bias potential established upon a potentiometer 174 by a switch device 172; the switch device 172 may illustratively be a MOS switch and is selectively opened and closed in response to a second (reference) clamp signal (see FIG. 5N) applied to its terminal 171. The point of interconnection between the switch 172 and the clamp capacitor 168 is coupled to the high impedance input of the operational amplifier 170; the operational amplifier 170 has a feedback network including the resistive elements 178 and 176. In turn, the output of the operational amplifier 170 is applied to a further switch device 180 to be opened or closed in accordance with a control voltage applied to its input terminal 181. In its closed position, the switch 180 applies the output of the operational amplifier 170 to a capacitor 183 coupled to ground and to the high impedance input of an operational amplifier 182. The operational amplifier 182 includes a feedback circuit including resistive elements 186 and 184. As shown in FIG. 1, the output of the operational amplifier 182 represents the sum of the products of the output of the CCD outputs and the positive weighting factors less the products of the CCD outputs and the negative weighting factors.

As explained above, the multiplexer 199 receives and samples the input signal whereby alternate pulses of the sampled portions of the input signal are interspaced between a reference signal whose level corresponds to the zero reference level of the input signal. Thus, a sampled portion of the input signal and a reference level signal are sequentially moved down from well to well along the length of the CCD 10. Output signals are derived from the electrodes 100 associated with alternate wells beneath the $\phi_1$ electrodes 92 as generally shown in FIG. 1. As indicated in FIGS. 1 and 2A, outputs are derived from the electrodes 100-2 and 100-4, whereas no output signals are derived from the well associated with the $\phi_1$ electrodes 92 of the cells 14-1 and 14-3. As a result, at one instant of time, charge packets corresponding to sequentially injected reference level signal pulses (as so identified in FIG. 5K) may be stored in the wells associated with the cells 14-2 and 14-4, to be read out and applied to the summing bars 24a and 24b. At this instant of time, the charge packets corresponding to sequentially inserted sampled portions of the input signal are disposed in the wells associated with the cells 14-1 and 14-3 and are not read out. As the clock signals $\phi_1$ to $\phi_4$ are applied to the CCD 10, the charge packets are shifted so that the charge packets corresponding to the sampled signal (as so indicated in FIG. 5K for signals giving full wells of charge) are disposed in the cells 14-2 and 14-4 to be read out, while the charge packets corresponding to the pulsed reference signal are disposed in the cells 14-3 and 14-5. In this manner, by taking outputs from alternate cells 14, the sampled portions of the input signal may be read out simultaneously from the even-numbered cells 14 and then transferred to the odd-numbered cells 14, at which time samples of the reference level signal are read out. Further, an output is derived from each of the bus bars 24a and 24b at those times at which an empty well is disposed beneath the $\phi_1$ electrodes 92 of the even-numbered cells 14. The output at this instant is sampled and is subtracted, as will be explained, to remove the effect of reset noise.

Figure 5M:
Figure 5N:

The analog reconstruction circuit 32 operates to sample and hold the summed samples of the reference level pulses and those signals derived from the empty well of the CCD 10, to be subtracted from the sampled input signal in the following manner. First, the reset noise signals are derived from the electrodes 100 to be summed by the operational amplifiers 140 and 142 and to be preamplified by the operational amplifier 146 to charge the capacitor 148; during this first step, the switch 152 is closed in response to the first clamp pulse as shown in FIG. 5L, whereby the capacitor 148 is coupled to the biasing voltage $-V_C$. Next, switch 152 is opened, the switch 160 is closed and then opened in response to the first sample pulse as shown in FIG. 5M, and switch 172 is closed and then opened in response to the second or reference clamp pulse as seen in FIG. 5N, whereby the summed reference samples of the input reference level held in the even-numbered cells 14 are applied to the capacitor 148, whereby that signal indicative of the reset noise is subtracted from the samples of the input reference level to remove the noise content therefrom; in turn, the resulting true reference level is applied to the operational amplifier 150 to be stored upon the capacitor 161 by operating switch 160.

Figure 5O:
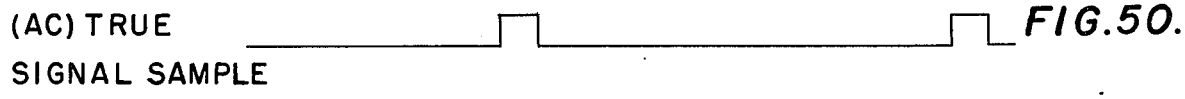

Next, the serially inserted signal samples are shifted to the even-numbered cells 14 and are read out and applied to the analog reconstruction circuit 32. In this step, the switches 152 and 172 (switch 172 is operated in response to the second reference clamp pulse as shown in FIG. 5N), are operated (i.e., closed then opened), whereby the summed outputs corresponding to the true reference samples serve to charge the capacitor 168, the switch 160 is operated, and the switch 180 is operated in response to the pulse as shown in FIG. 5O, such that the capacitor 161 is newly-charged to a level indicative of the summed outputs corresponding to the gross signal samples, from which is subtracted the true reference level as stored on capacitor 168 to give the true signal equal to the difference between the gross signal sample and the reference sample. While an empty well is shifted beneath the $\phi_1$ electrode 92 of each of the even-numbered cells 14, a signal corresponding to an empty well indicative of the reset noise present in the CCD 10 is read out and is applied to the analog reconstruction circuit 32, wherein the reset error signal is applied to the capacitor 148 to provide a signal indicative of the difference therebetween, i.e., the signal sample with reset noise removed, which then is stored upon the capacitor 161. Thus, as a result of the four steps, a reset error signal is derived and stored, to be subsequently subtracted from the summed portions of the reference level sample. Again, the reset level is sampled and stored to be subtracted from the signal sample. Finally, the zero reference level signal, free of reset noise, is then subtracted from the signal sample, free of the reset noise, to provide an output of the circuit 32 and the system of FIG. 1, that is adjusted for DC system drifts and free of reset readout noise. The first clamp, first sample, second or reference clamp and true signal sample pulses as seen in FIGS. 5L to 5O, respectively, are readily provided by the CCD master clock circuit 11, as shown in FIG. 1.

Thus, to the greatest degree possible, all input signals pass through the same elements and the corresponding signal samples and zero-reference level samples pass through identical on-chip paths. Thus, the DC biased errors are compensated for by the use of the zero signal reference level sample, while the empty wells are sampled to remove reset noise from the summed samples. Further, the DC biased errors typically vary at a slow rate, such that the zero signal reference need not in one embodiment be interlaced between alternate signal samples, but may be injected only occasionally. Further, since the signal path during the closed loop programming calibration is the same as that for normal operation, random topographic variations in the device are compensated by the electrical adjustment made to the weighting factors written into the MNOS FET's 22, as explained above.

Figure 2B:
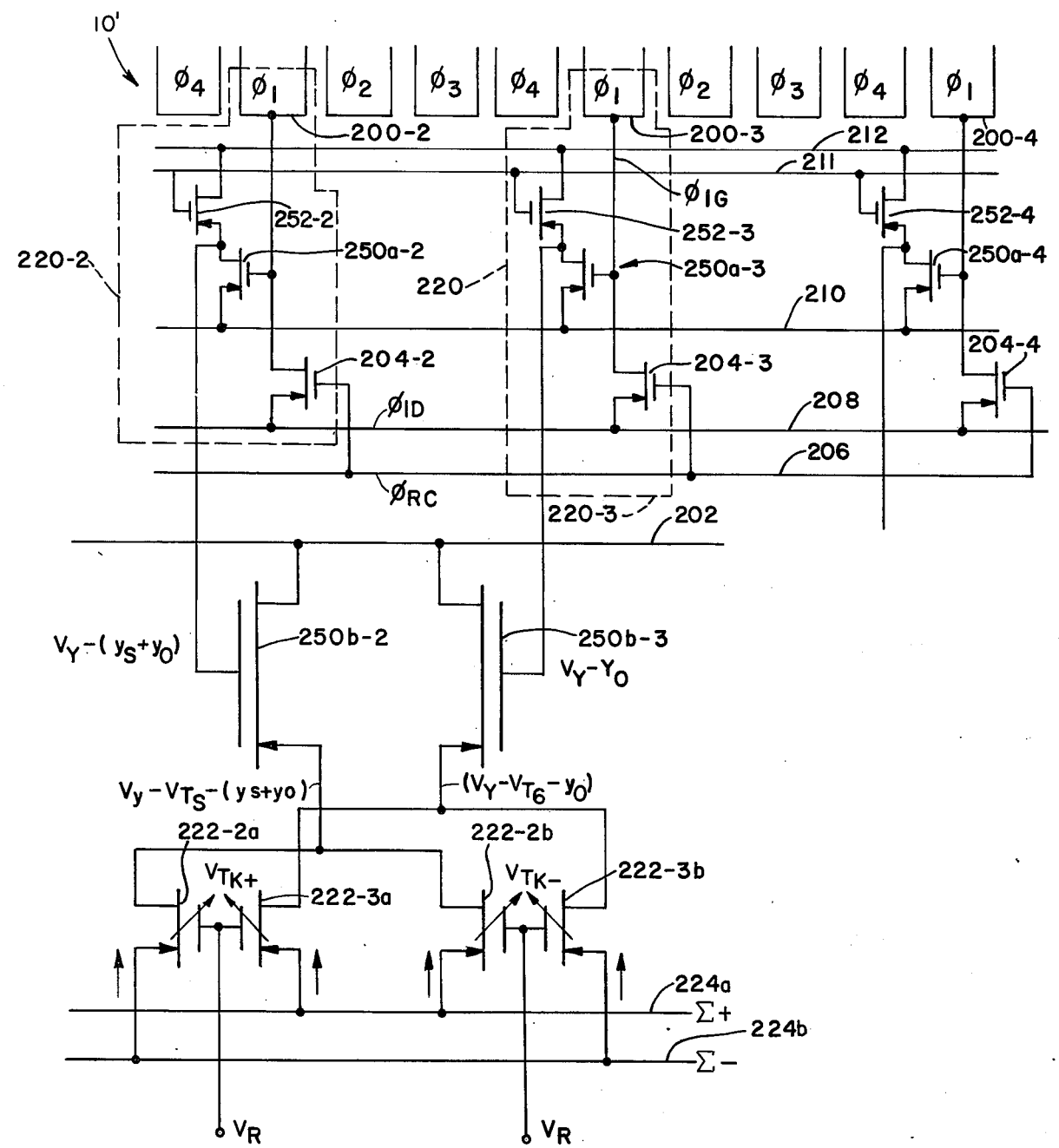

In FIGS. 10 and 2B, there is shown a further, illustrative embodiment of the manner in which the parallel outputs of a CCD 10' may be non-destructively read out and multiplicatively weighted. By contrast to the embodiment of FIG. 2A, wherein P+ diffusion regions 78 were provided underneath selected of the CCD electrodes, there is shown in FIG. 10 that the output of the CCD 10' is derived directly from the $\phi_1$ electrode and is selectively read out by a read/clock gate and/or switch illustratively taking the form of a MOS FET 204 whose drain is connected to the $\phi_1$ electrode 200'. Further, a clock driver signal $\phi_{1D}$ (corresponding to the previously-described signal $\phi_1$), as shown in FIG. 11D, is applied to the source of the clock switch 204 under the control of a read/clock signal $\phi_{RC}$ as shown in FIG. 11H. As shown in FIG. 11H, when the read/clock signal $\phi_{RC}$ goes low, the read/clock switch 204 is turned on whereby the clock driver $\phi_{1D}$ is applied to the $\phi_1$ electrode 200', whereas when the read/clock signal $\phi_{RC}$ goes high, the read/clock switch 204 is turned off and a signal voltage $\phi_{1G}$, as seen in FIG. 11J, induced by the charge packet built up within the well beneath the $\phi_1$ electrode 200', is read out and applied to the electrometer amplifier comprising a MOS FET 248.

In FIG. 2B, there is shown in detail a schematic whereby the signals derived from $\phi_1$ electrodes 200-2, 200-3 and 200-4 are selectively read out and applied through sensing buffer amplifiers indicated generally by the numeral 220 to be multiplied with programmed values written as described above on memory elements taking the form of the MNOS FET's indicated generally by the numeral 222, whose sources are connected to one of the negative and positive summing bars 224a and 224b. In particular, the $\phi_1$ electrode 200-3 is connected to the sensing buffer amplifier 220-3 and in particular to the gate of a sensing buffer amplifier taking the form of a MOS FET 250a-3, whose source is connected to a common source bus 210 and whose drain is connected to the source of a buffer amplifier load device taking the form of a MOS FET 252-3, whose gate is connected to a common load device gate bus 211 and whose drain is connected to a common drain bus 212. With the MOS FET 252-3 acting primarily as a load or resistive device, the conductance of the MOS FET 250a-3 is varied in accordance with the voltage applied to its gate as derived from the $\phi_1$ electrode 200-3, whereby a variable voltage is supplied to the gate of a source follower MOS FET 250b-3. The buffer amplifier load device 252-3 and the sensing buffer amplifier 250a-3 form a unity gain inverter to supply a voltage variable in accordance with the signal $\phi_{1G}$ induced in the $\phi_1$ electrode 200-3. Further, the gate of the sensing buffer amplifier 250a-3 is connected selectively by the read/clock switch 204-3 to a driver bus 208, when the read/clock switch 204-3 is rendered conductive in response to the read/clock signal $\phi_{RC}$, as applied to its gate from a common bus 206. As explained above, when the read/clock switch 204-3 is rendered non-conductive, the signal induced in the $\phi_1$ electrode 200-3 controls the voltage as derived from the drain of the sensing buffer amplifier 250a-3. Illustratively, a voltage in the range of −20V to −30V is applied by the bus 212 to the drains of each of the MOS FET's 252, a voltage in the range of −20V to −30V is applied by the common load device gate bus 211 to the gate of the MOS FET's 252, and a DC voltage $V_{BB}$ in the range of 0V to −5V is applied by the common source bus 210 to the sources of each of the MOS FET's 250a. In a similar manner, the buses 208 and 206 respectively apply the clock driver signal $\phi_{1D}$ and the clock/read signal $\phi_{RC}$ to the gate and drain of the MOS FET's 204.

The input section of the CCD 10' is similar to that shown in FIG. 3, and a signal is injected therein in a similar manner as by the voltage waveforms shown in FIG. 11. The structure as shown in FIG. 3 may be modified to the extent that the electrodes $\phi_{1A}$ and $\phi_{1B}$ are connected electrically off-chip and a signal $\phi_A$ as shown in FIG. 11C is applied thereto. Further, the $\phi_{1D}$, $\phi_2$, $\phi_3$ and $\phi_4$ signals as shown in FIGS. 11D to 11G are applied to the corresponding electrodes of the CCD 10' as shown in FIG. 2B, whereby the charge packet is advanced successively to wells underneath these electrodes, as indicated by the arrows in the FIGS. 11B to 11G. As seen in FIG. 11H, the read/clock signal $\phi_{RC}$ maintains the read/clock switch 204 conductive whereby the $\phi_1$ electrode 200' is connected to the clock driver signal $\phi_{1D}$ for approximately one-half of the bit period. At the end of the half-cycle, the $\phi_1$ electrode 200' is reset in that it is disposed at a potential which is established as a surface potential receiving well therebeneath for receiving minority carriers. As seen in FIGS. 11D and 11H, the read/clock clock switch 204 is rendered conductive as the read/clock signal $\phi_{RC}$ goes low; during this period, the drive signal $\phi_{1D}$ goes high, thereby repulsing charge carriers from beneath the $\phi_1$ electrode 200' to provide an essentially open well at the end of the reset period. When the read/clock switch 204 opens, the $\phi_1$ electrode "floats", assuming a potential corresponding to the charge that gradually builds up therein as indicated in FIG. 11J. In particular, the $\phi_1$ electrode 200' becomes a high impedance node which has been reset to a predetermined potential, a measure of which is clamped as indicated by C in FIG. 11D on another capacitor for reference later in the cycle. As indicated in FIGS. 11D to 11G, the propagation action of charges through the wells beneath the $\phi_1$, $\phi_2$, $\phi_3$ and $\phi_4$ electrodes then gates or muxes, indicated by M in FIG. 11D, the charge packet into the surface potential receiving depletion region underneath the $\phi_1$ electrode 200', across which most of the read/clock signal voltage appears. The build-up of charges as indicated in FIG. 11J proceeds through the steps of resetting, clamping, charge advance or muxing, and sampling, explained in some detail above with respect to FIGS. 5A to 5J.

The buffer circuit 220 as shown in FIG. 2B converts the high impedance as presented at the $\phi_1$ electrode 200 to a relatively low impedance at its output, i.e., the drain of the sensing buffer amplifier 250a. Illustratively, the impedance is reduced by the circuit 220 from a value in the order of 100K ohms to 50K ohms. To further reduce the $\phi_1$ electrode impedance, the output of a buffer circuit is supplied to the source follower MOS FET indicated generally by the numeral 250b, whose drain is coupled by a common bus 202 to a reference voltage $V_{DD}$, while its source or output is selectively applied to the drains of the memory devices 222. In particular, the MOS FET 250b further reduces the impedance from a value in the order of 10K to approximately 1K. As shown in FIG. 2B, the output of the buffer circuit 220-2, similar to the buffer circuit 220-3, is applied to the gate of the source follower MOS FET 250b-2, which serves a similar function to that of source follower MOS FET 250b-3, i.e., further reducing the impedance as presented to the memory devices 222. Thus, the buffer circuits 220 and the MOS FET's 250b form a two-stage impedance reduction before a signal, indicative of the charge packet stored in the wells beneath the $\phi_1$ electrodes 200-2 and 200-3, is applied to the memory devices 222 to be multiplied with values as set therein and to be differenced with each other in a manner to be explained.

Figure 12:
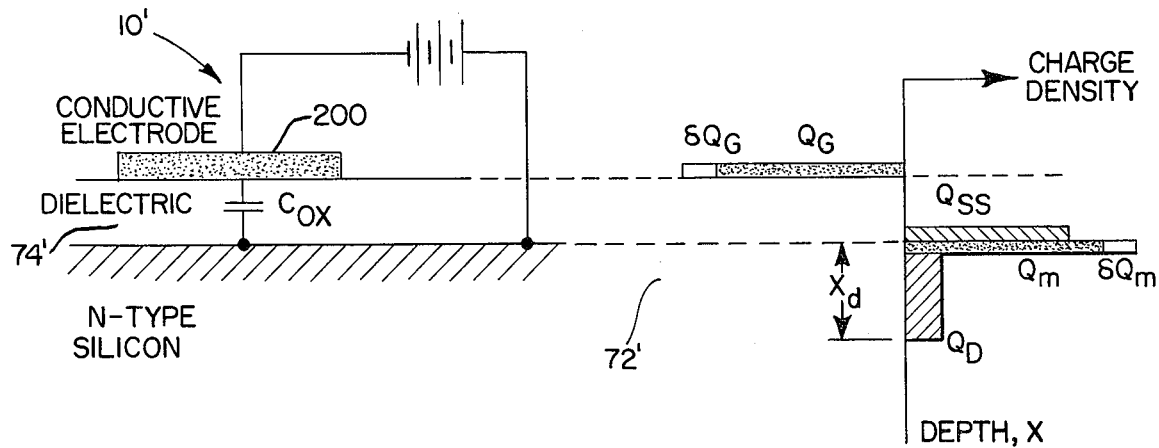
FIG. 12 shows a generalized, cross-sectional view of the CCD of FIGS. 2B and 10, particularly illustrating the charge patterns established therein.

In FIG. 12, there is shown a cross-section of the CCD 10', having an N-type silicon layer 72' covered by a dielectric 74', and in which various charges are built up in accordance with the following equations:

$$Q_G + Q_{SS} + Q_S = 0 \quad (13)$$

where
$Q_G = C_{ox}V_{ox}$ = charge on conductive gate
$C_{ox}$ = Oxide capacitance under gate
$V_{ox}$ = Potential energy drop though the oxide, (14)
$Q_{SS}$ = charge trapped at oxide/silicon interface, and (15)
$Q_S = Q_D + Q_M$, with (16)
$Q_D = -q\, N_D X_d$, $N_D$ = donor concentration, (17)
$X_d = (2k_s\epsilon_0\phi_s/qN_D)^{1/2}$ = depletion depth, and
$\phi$ = silicon surface potential,
$Q_M$ = mobile minority charge carriers (18)

Combining equations (17) and (18) gives us $$\frac{Q_D}{C_{ox}} = -\sqrt{2\, \frac{K_s\epsilon_0 qN_D}{C_{ox}}}\, \phi_s = 1(2V^*\phi_s)^{1/2} \text{ where} \quad (19)$$

$$V = \frac{K_s\epsilon_0 qN_D}{C_{ox}}. \quad (20)$$

Summation of the potential energies yields $$V_G = \phi_1 \text{ gate potential} = V_{ox} + \phi_s + \phi_{ms} \quad (21)$$

($\phi_{ms}$ = metal-semiconductor work-function difference)

Temporarily, we assume that $V_G$ is a voltage source like a battery; so that differentiation yields:

$$\delta V_g = 0 = \delta V_{ox} + \delta\phi_s. \quad (22)$$

But from equation (14), $\delta Q_G$ = displacement charge − $C_{ox} \cdot (\delta V_{ox})$ or $$\delta Q_G = -C_{ox} \cdot \delta\phi_s \quad (23)$$

Combining (13), (14), (16) and (19) gives:

$$C_{ox}V_{ox} + Q_{SS} + Q_M - C_{ox}(2V_*\phi_s)^{1/2} = 0 \quad (24)$$

Substituting equation (21):

$$\phi_s + (2V_*\phi_s)^{1/2} = V_G - \phi_{MS} + (Q_{SS}+Q_M)/C_{ox} \quad (25)$$

Differentiating:

$$\delta\phi_s = \delta Q_M/C_{ox} \cdot \left[1 + \left(\frac{V_*}{2\phi_s}\right)^{1/2}\right] \quad (26)$$

where $\delta Q_m$ = incremental signal charges injected into depletion region. Finally (23) and (26) are combined to give:

$$\delta Q_G = \text{displacement charge} = -\left[1 + \left(\frac{V_*}{2\phi_s}\right)^{1/2}\right]^{-1} \delta Q_m \quad (27)$$

Typically $|V_*| \simeq 0.1$ to $0.2V$, while $5 \leq |\phi_s| \geq 20V$, so that
(28) $\delta Q_G$ = displacement charge $\cong -\delta Q_m$ = signal charge.

But in the case when the battery is disconnected (as after reset), the only source of displacement charge is the combination of all other capacitances at the amplifier gate node, $C_{SIG}$:

$$\delta Q_G = -C_{SIG} \cdot \delta V_G \quad (29)$$

Combining (21) and (29) gives:

$$-\frac{\delta Q_G}{C_{SIG}} = \delta V_{ox} + \delta\phi_s, \quad (30)$$

into which we substitute (14):

$$\delta Q_G = \frac{-C_{SIG} \cdot C_{ox}}{C_{SIG} + C_{ox}} \cdot \delta\phi_s \quad (31)$$

Finally, this is combined with (26) to yield:

$$\left| \begin{array}{l} \delta Q_1 \cong \dfrac{-C_{SIG}}{C_{SIG} + C_{ox}} \delta Q_m \\ \delta V_o = \dfrac{-\delta Q_m}{C_{SIG} + C_{ox}} \end{array} \right| \text{ or } \quad (32)$$

Equation (32) describes the potential appearing at the gate of the sensing buffer amplifier 250a, whose waveform is shown in FIG. 11J. After the signal corresponding to this charge has been advanced into the potential well underneath the $\phi_1$ electrode 200 and the adjacent potential barriers re-established, the signal is sampled as indicated by the S in FIGS. 11D and 11J and differenced against the previously-stored reference reset level to cancel any reset noise in a manner similar to that explained above. Next, the signal packet is transferred to the next, successive cell with the read/clock switch 204 rendered conductive to apply the driver signal $\phi_{1D}$ to the $\phi_1$ electrode 200.

The memory devices taking the illustrative form of MNOS FET's 222 serve essentially the same function as the memory devices 22 as shown in FIG. 1, i.e., to multiply the outputs as derived from the source of the MOS FET's 250b, indicative of the charge packets appearing beneath the corresponding $\phi_1$ electrodes 200, by values as written or stored therein in accordance with a set of programmed constants. In particular, the souce of the MOS FET 250b-2 is coupled to the drain of each of the MNOS FET memory multiplying devices 222-2a and 222-2b. Similarly, the source of the MOS FET 250b-3 is coupled to each of the drains of the MNOS FET memory multiplying devices 222-3a and 222-3b. Further, outputs indicative of the multiplied values are derived from the sources of the MNOS FET memory multiplying devices 222-3a and 222-3b, and applied to the positive and negative summing bars 224a and 224b. In a similar manner, the outputs are obtained from the source electrodes of the MNOS FET memory multiplying devices 222-2a and 222-2b to be applied to the negative and positive summing bars 224b and 224a. As explained above, samples of a reference level signal are alternately applied along with samples of the input signal to be transferred along the length of the CCD 10'. As a result, at any one instant of time, when an output is sampled from $\phi_1$ electrodes 200-2 and 200-3, a sample of the input signal indicative of the bias level upon which the input signal is imposed, appears simultaneously, during the same sample interval after the associated reset/clamp levels were presented simultaneously earlier in that sample interval. Thus, any reset noise that may be imposed upon the input signal as it is propagated along the length of CCD 10', is removed by subtracting the associated reset/clamp level outputs from the subsequent outputs for the difference between the samples of the input signal and the reference level signal appearing at the $\phi_1$ electrodes 200-2 and 200-3. Thus, as seen in FIG. 2B, a signal indicative of the charges underneath the $\phi_1$ electrodes 200-2 and 200-3 appear at the output or source electrodes of the MOS FET's 250b-2 and 250b-3. For example, if a sample input signal appears inverted at the source of the MOS FET 250b-2, it will be multiplied by a positive constant stored in the MNOS FET memory device 222-2a to provide an output to the negative summing bar 224b. At the same time, a signal indicative of the inverted reference level signal is applied to the MNOS FET 222-3a to be multiplied by a corresponding value as stored therein and to be applied to the positive summing bar 224a, whereby a difference is obtained between the signals appearing on the bars 224a and 224b is provided by a reconstruction circuit similar to that shown in FIG. 1. It is noted that two sets of memory devices 222 are provided, one for a negative and for a positive constant. Programming of the positive and negative constants may be carried out in a manner shown and explained with respect to FIG. 1. In particular, the outputs of the switches 28 of FIG. 1 may be applied to the gates of the memory devices 222, whereby the threshold value of these MNOS FET's may be changed in accordance with the desired program. One advantage of the array of memory devices 222 as shown in FIG. 2B is that a portion of the analog reconstruction circuit as shown in FIG. 1 may be eliminated; in particular, since the memory devices 222 are connected in a manner whereby a difference is obtained between the sampled input signal and sampled reference level, the operational amplifiers 170 and 182 may be eliminated and a suitable output derived from operational amplifier 162.

In an illustrative embodiment wherein the memory devices 222 take the form of MNOS FET's operating in their triode region, the drain current therein is given by the expression:

$$I_D = \mu C_o \cdot \frac{W}{L} \cdot \left[ V_{DS} \cdot \left[ V_{GS} - \phi_{MS} - \phi_S(inv) + \frac{Q_{SS}}{C_o} \right] - \frac{V_{bs}}{2} - \frac{4\phi_F}{3} V_b \left[ \left(1 + \frac{V_{DS}}{2\phi_F}\right) - 1 \right] \right]$$
(33)

Applying the triode region limitation ($V_{DS} \ll V_{GS}$), we find:

$$I_D = \alpha \cdot [V_{DS} \cdot (V_{GS} - V_T) + z(V_{DS})] \text{ where } \alpha = C_o \cdot W/L \quad (34)$$

$V_{DS}$ = source-drain potential difference,
$V_{GS}$ = source-gate potential difference,
$V_T$ = threshold voltage,
$z(V_{DS})$ = generalized non-linear contribution.

We now use this equation to explain the overall multiplying action of the memory device 222 shown in FIG. 2B.

With reference to FIG. 2B, if we designate the charge packets when the signal and its reference or AC zero are sampled by $(y_s + y_o)$, $(y_o)$ and the program memory threshold ($V_{T_{K+}}$, $V_{T_{K-}}$) of the devices 222-2/3a, 222-2/3b, respectively designate the reference; then the various currents to be summed are:

$$I_{1a} = \alpha_1 \cdot (V_R - V_{T_{K+}}) \cdot (V_Y + y_s + y_o - V_{T_5}) + z_1 \quad (35)$$

$$I_{3a} = \alpha_2 \cdot (V_R - V_{T_{K+}}) \cdot (V_y + y_o - V_{T_6}) + z_2 \quad (36)$$

$$I_{2b} = \alpha_3 \cdot (V_R - V_{T_{K-}}) \cdot (V_Y + y_s + y_o - V_{T_5}) + z_3 \quad (37)$$

$$I_{3b} = \alpha_4 \cdot (V_R - V_{T_{K-}}) \cdot (V_Y + y_o - V_{T_6}) = z_4 \quad (38)$$

Now let $\alpha_K = \alpha + \delta\alpha_K$, $V_{T_K} = V_T + \delta V_{T_K}$, and $z_K = z + \delta_{z_K}$, so that $$I_{2b} - I_{1a} = \alpha \cdot (V_{T_{K+}} - V_{T_{K-}} - \Delta V_{T_K}) \cdot (V_Y + y_s + y_o - V_{T_5}) + (\delta_z) + (\delta\alpha)(\dots) \quad (39)$$

$$I_{3b}-I_{3a} = \alpha.(V_{T_K-}-V_{T_K-}-\Delta V_{T_K-}).(V_Y+y_c-V_{T_6}) +(\delta_z) \\ + (\delta\alpha) (\ldots) \quad (40)$$

Finally, we find that $\Sigma_K = (\Sigma+)_K-(\Sigma-)_K = (I_{2b}-I_{2a})-\lambda$ $(I_{3b}-I_{3a})$ or $$\Sigma_K = \alpha.(V_{T_K-}-V_{T_K-}-\Delta V_{T_K-}).(y_s-\delta V_T)+(\delta_z)+(\delta\alpha)(\ldots) \quad (41)$$

In the ideal limit of $(\delta V_T, \delta\alpha, \delta_2) \rightarrow 0$, we have $$\Sigma_K = W_K \cdot 1/s, \text{ where } W_K=\alpha(V_{T_K-}-V_{T_K-})=K^{th} \text{ weighting factor} \quad (42)$$

when the transistor geometries and threshold voltages are truly matched within the $K^{th}$ multiplier cell. Consequently, the double differential operation of the multiplier cell, as indicated in FIG. 2A, automatically cancels undesirable biases and nonlinearities because the six transistors are fabricated in a compact cell area, facilitating the needed matching of geometries and threshold voltages. Thus, when the $W_K=\alpha(V_{T_K}^+ - V_{T_K}^-)$ is taken as the programmed multiplier constant and the signal $y_s$ is the sampled input as read out from the selected $\phi_1$ electrode 200, it is seen that the summed output as derived from the bars 24a and 24b is linearly proportional to the product of the sampled signal and the programmed multiplier constant.

This dual-differential operation has another important benefit. The accumulation of thermal leakage or dark-current charge in the CCD 10' potential wells is indistinguishable from the desired signal charge. In the signal channel CCD 10', both the reference signal sample and the signal sample pass through the same elements taking identical on-chip paths. Hence, each will contain identical dark-current accumulation which cancels in the differential operation.

Figure 6:
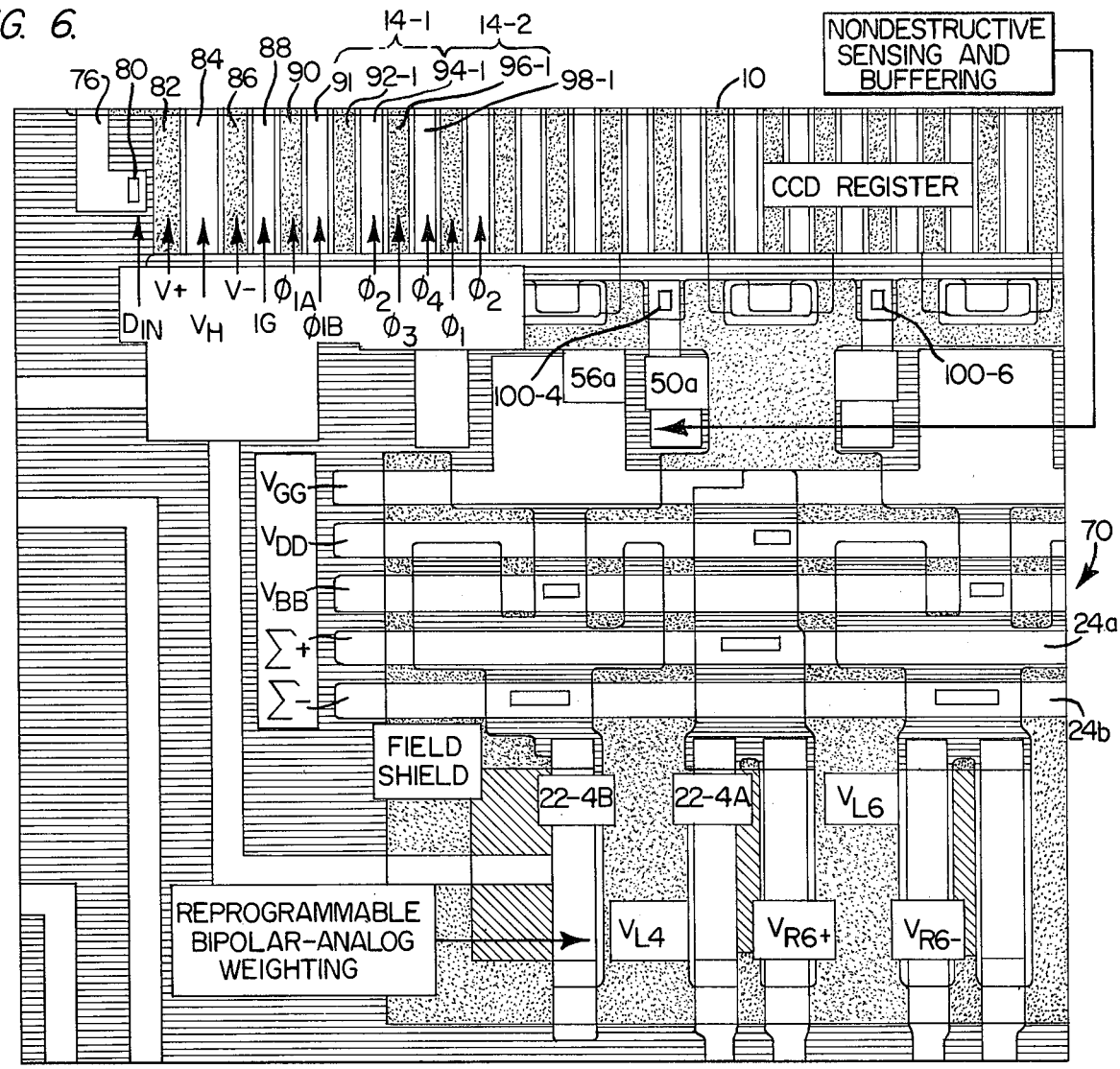
FIG. 6 is a plan view of a large-scale integrated circuit incorporating the CCD and the plurality of MNOS devices as shown in FIGS. 2A and 3.

The CCD 10 and the plurality of MNOS FET's 22 as shown in FIG. 2A are capable of being manufactured into a single integrated circuit by LSI techniques, to be described. A layout pattern for such a substrate is shown in FIG. 6, with similar numerals and letter designations as explained above with regard to FIGS. 1, 2 and 3, being used in FIG. 6 to designate the corresponding portions of the semiconductor substrate. In particular, stabilized charge injector 12 as shown in cross-section in FIG. 3, is depicted in FIG. 6 in terms of the electrode 80 disposed in contact with the P+ diffusion region 76, and the series of electrodes 82 to 91. Further, there is illustrated the series of CCD cells 14-1, 14-2, et seq., each including electrodes 91, 92, 94, 96 and 98 to which are applied, respectively, the $\phi_1$, $\phi_2$, $\phi_3$ and $\phi_4$ shift signals. Outputs are derived through the electrodes 100 to be applied to the transistors 50 and 56 whose gate regions are illustrated in FIG. 6 and identified by the numerals 56a and 50b. Conductive strips are laid upon the LSI substrate for the $V_{GG}$, $V_{DD}$, $V_{BB}$ voltages and provide positive and negative summing bars 24a and 24b to make contact to the corresponding electrodes of the MOS FET's 50, 58, 52, 54, 56, (not fully shown in FIG. 6) and the plurality of the memory MNOS FET's 22.

Figure 7A:
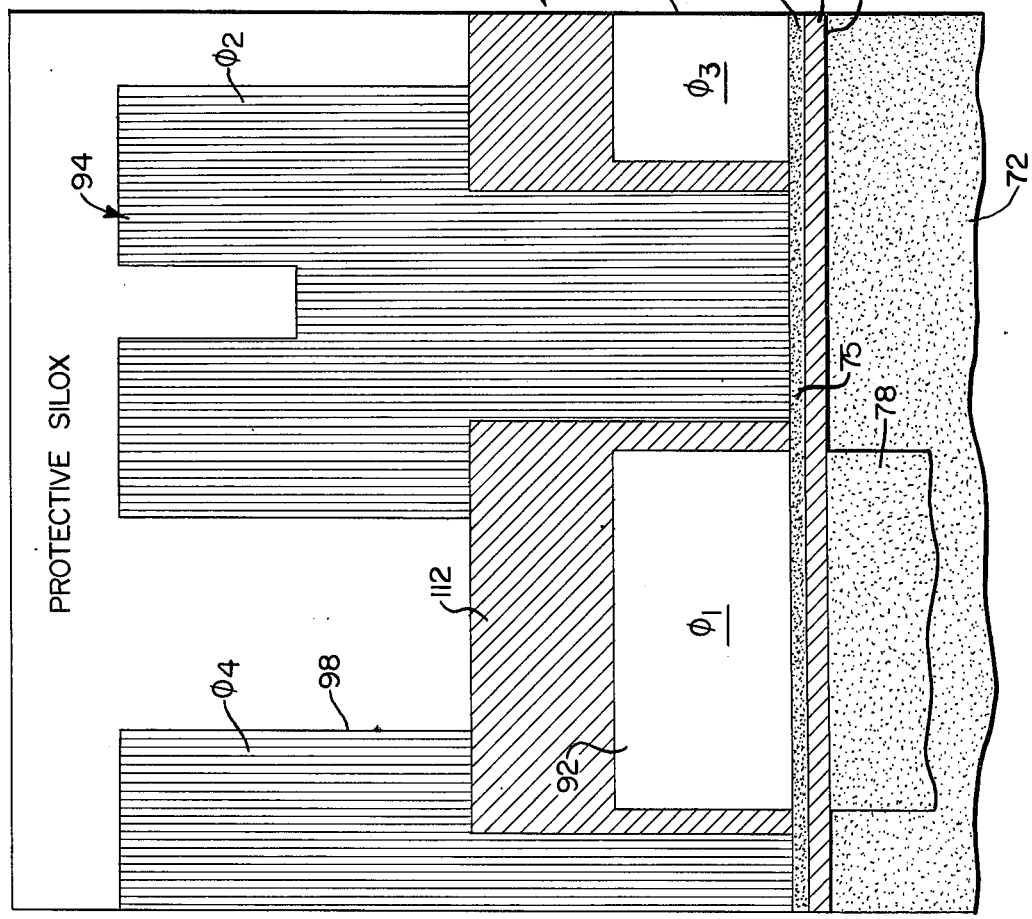

In FIGS. 7A and 7B, there are shown cross-sectional views of the LSI assembly respectively of a portion of the CCD 10 and of the memory MNOS FET's 22. In FIG. 7A, the CCD 10 includes the N-type slicon substrate 72 into which is diffused a shallow P+ diffusion region 78 for providing output signals for the case of one of the described embodiments corresponding to that charge packet as shifted down the linear length of the CCD 10 and stored within the silicon substrate layer 72 in an area beneath the $\phi_1$ electrode 92, illustratively made of polycrystalline silicon. A layer 75 of silicon nitride is deposited over the silicon dioxide layer 74. A layer 112 of thermal oxide is deposited over the $\phi_1$ electrode 92 and thereafter the electrodes 94 and 98 are formed of aluminum.

Figure 13A:
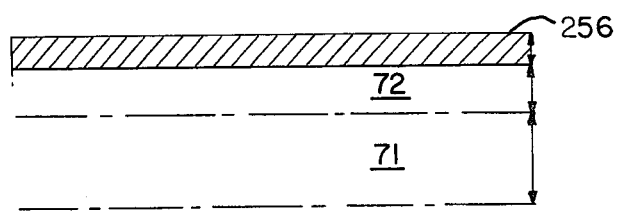
Figure 13B:
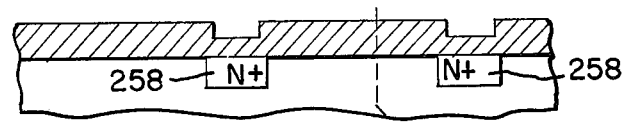
Figure 13C:
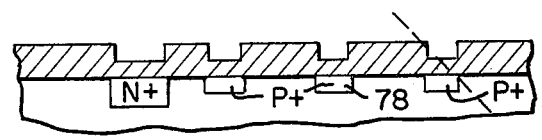
Figure 13D:
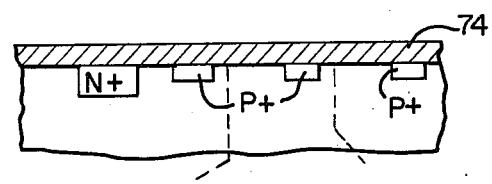
Figure 13E:
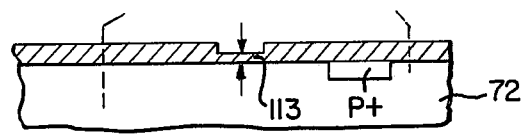

In FIG. 7B, a cross-sectional view of an MNOS FET is shown as comprising an N-type layer 72 into which is deposited a P-type drain region 116 and a P-type source region 118. Successive silicon oxide and silicon nitride layers 74 and 75 are disposed upon the substrate 72. As illustrated in FIG. 7B, a memory window 113 is formed of approximately 25 to 50 A of silicon dioxide. Next, a PSI field shield 110 is formed covered by a layer 112 of silicon oxide. A window 111 is formed in the silicon oxide layer 112 as shown in FIGS. 13H and 13J through which deposited electrodes 100 of aluminum contact the PSI electrodes.

In one illustrative method, the fabrication sequence comprises seven photographic mask steps with silicon nitride ($Si_3N_4$) passivation and aluminum/polysilicon interconnections. As shown in FIG. 7A, the CCD 10 is basically a silicon nitride $Si_3N_4/SiO_2$ dielectric with overlapping, aluminum polysilicon electrodes to form a sealed, surface channel CCD.

System applications as described herein of charge-coupled device arrays require support circuitry to be constructed on the same chip as the arrays. These devices will need to be electrically isolated from each other and the array. To accomplish this end, the arrays are fabricated in an N-type epitaxial layer 72 grown on a P-type substrate 71, as shown in FIG. 13A. The epitaxial material is typically 6–10 ohm-cm resistivity, 8–12 microns thick with the P-type substrate having a resistivity of 10–40 ohms-cm and a <100> orientation. The selection of doping levels derives from the following rationale. Generally, the support circuits on the chip remain connected to peripheral devices while the memory region is cleared by pulsing both the P-type substrate and the memory region negative. Thus, depletion regions form downward from transistor drains in the support circuits and upward from the reversed-bias substrate. These two depletion regions must not punch through to each other. The larger doping in the epitaxial region helps minimize those two depletion regions, while forcing much of the substrate clear/reverse bias to drop across the depletion region into the substrate. Adequate epitaxial region thickness also helps prevent punch-through. Here again, the higher phosphorus doping of the epitaxial layer 72 is needed to prevent the substrate 74 boron doping from moving the junction up into the epitaxial layer 72 during processing. The <100> orientation is preferred from standard MOS processing technology considerations. The isolation is obtained by diffusing a P-type region around the desired devices which penetrates the entire epitaxial thickness. To ease the change to on-chip support circuits, the current chip processing uses the epitaxial material even though, at present, no support circuits are on the chip. This allows the arrays to be fabricated on the final type of material required and allows any material related processing problems to be dealt with at this point in time.

After being inspected, the wafers are cleaned and thermally oxidized to 6 kA to provide a masking layer 256 for the N+ and P+ diffusions, as shown in FIG.

13A. At this point, the wafers are again inspected for evidence of slip planes, such as striations in the oxide when viewed through a microscope, which after processing become gross defects in the wafers. Wafers exhibiting any evidence of slip planes are rejected from further processing and are used as test pieces to monitor the diffusion processes.

The six-thousand angstrom thermal oxide layer 256 is used as both the N+ and the P+ diffusion masks. The N+ diffusion, shown in FIG. 13B, is used to provide the channel stop regions 258 and contact regions. The N+ region is provided in a deposition and drive diffusion sequence. The deposition is done at 950° C, with the drive being approximately 1 hour at 1,000° C. This process results in a sheet resistance of 30 ohms per square about 1.5 microns deep. The drive in a steam atmosphere results in a 3 kA of thermal being grown in the N+ windows and is sufficient to mask the succeeding P+ diffusion.

The P+ diffusion windows are next opened in the accumulated thermal oxide. The P+ diffusion, illustrated in FIG. 13C, provides the sources and drains region for the CDS output circuit, the non-destructive sensing tap diffusions, the injection and detection diodes, and source and drain for the MNOS transistors. The P+ diffusion is very shallow, and is carried out at 1,000° C, in a one-step diffusion. The process results in a diffusion region 78 < 8 kA, with a sheet resistivity of 10 ohms per square.

The described method of processing permits the incorporation of the MNOS structure into an array with a CCD. To make such an array, the next step is to provide the oxide layer 74 for the non-memory transistor 22 and the CCD 10. This is accomplished by completely stripping the previous oxide layers which were used to define the N+ and P+ diffusion and growing a 1 kA thermal oxide layer 74, as shown in FIG. 13D. While this oxide layer is not as critical as the thin memory oxide to be grown later, it is grown in an HCl + $O_2$ atmosphere. Including HCl in the oxide growth process has been shown to improve the stability and performance of MNOS devices 22.

The alignment of the memory oxide window is one of the most difficult steps in the processing sequence. When the initial thick oxide is stripped, and the non-memory gate oxide is grown, the surface topology has become planar. The only steps remaining visible at the wafer surface are those in the silicon defined by the diffusions. The different oxidation rates of N and P doped material help slightly in pattern definition; alignment of the next mask through 8 kA of photo-resist is difficult, but can be done with proper techniques and engineering inspection. The small windows can be defined, as in FIG. 13E, without serious undercutting by using the thinner layer of photoresist indicated above (a normal thickness is 1.2–1.6 microns).

Figure 13F:
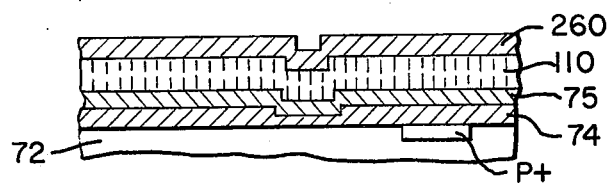

After properly aligning the memory oxide window, the wafers are processed through memory oxide growth, silicon nitride deposition, polysilicon deposition, polysilicon doping, and oxide (Silox) layer 260 deposition, illustrated in FIG. 13F, prior to the next photoengraving step. First, the wafers are cleaned in an acid cleaning sequence designed to yield the minimum amount of residual oxide in the memory window. A minimum residual oxide is required, since in a memory structure, the memory gate oxide is typically 20–50 A thick, depending upon the memory characteristics, i.e., write/read and clear pulse response and charge retention, required. A typical residual oxide is 4–10 A thick.

Immediately following the memory oxide growth, the silicon nitride layer 75 deposition is carried out. Tests have shown that if the residual oxide prior to nitride deposition is on the order of 10 A, the nitride process itself will increase the thickness to 20–30 A. With the residual oxide being 20–25 A, the silicon nitride deposition process does not cause any further increase in oxide thickness. The nitride deposition is carried out under the constraints of a low interface charge density. The result is a deposition at 750° C, 375 ± 35 A thick, with specified flows and growth rates. Uniformity and reproducibility of the nitride layer 75 has been excellent since the inclusion of the vertical deposition system into the processing sequence.

The polysilicon layer 110 is also deposited in the vertical system. The process is carried out at 700° C for 3 minutes, resulting in a 3.5 kA layer 110 being deposited. Experiments have shown that if the polysilicon layer is above 4 kA in thickness, the polysilicon will not etch uniformly after it has been doped with phosphorus. Thus, care is taken to hold the poly thickness to 3.5 kA, maximum. The polysilicon is doped N-type with a phosphorous diffusion, resulting in a deposition of 50 ohms per square sheet resistivity. This may seem to be rather high, but the polysilicon is being used as an electrode and as a field shield, not as a long conductor, and the 50 ohms per square is sufficient for this purpose. In contrast to other fabrication sequences, the polysilicon is doped prior to etching the poly pattern, rather than etch and dope afterwards. Experiments have shown the polysilicon layer 110 to etch more controllably and uniformly than in the reverse order processing.

A silox, pyrolitic oxide layer 260 from the reduction of silane, is deposited as shown in FIG. 13F over the doped polysilicon to provide a mask for etching the polysilicon. The pattern is defined in the oxide using photoresist and buffered HF, with the polysilicon being chemically etched with silox as the mask. The use of a chemical etch at this point versus the plasma etch technique is required since the plasma etches not only etches polysilicon, but will also etch the underlying nitride layer. Thus, it is very difficult to know when the plasma etch has broken through the polysilicon layer. The chemical etch, on the other hand, is preferential and will not attack the oxide layer.

Figure 13G:
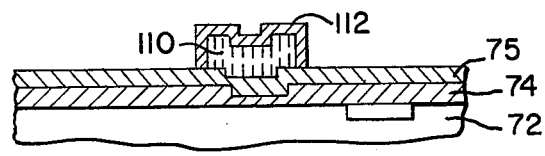
Figure 13H:
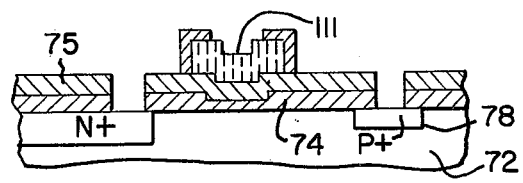
Figure 13J:
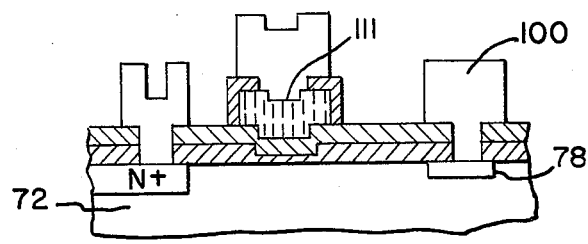

Having defined the polysilicon pattern, the layer 110 is thermally oxidized, as shown in FIG. 13G, to provide dielectric isolation between the polysilicon and the overlaying aluminum pattern. To minimize the effects of further processing in the memory gate oxide, the oxide layer 112 is grown in a steam plus $O_2$ ambient. Since the oxide layer 112 is 3 kA in thickness, a relatively high temperature, 1,000° C, is necessary to grow the oxide in a reasonable time. The use of a thermal oxide layer 112 as the dielectric versus a deposited oxide has stemmed from the greater integrity of the thermal oxide in terms of pinholes and step coverage. In the fabrication of a single array incorporating both the CCD 10 and a memory device 22, a problem exists in ensuring a high-quality interface between the silicon oxide layer 74 and the epitaxial layer 72. In order to form a CCD 10 capable of efficient charge transfer, this interface must be of exceptionally high quality having no charge traps or other crystal structure deformities. Further, the electrodes $\phi_1$ to $\phi_4$ should be disposed at substantially the same level. To this end, silicon nitride is used as an etch barrier with polysilicon electrodes thermally oxidized, thus permitting each of the $\phi_1$ to $\phi_4$ electrodes to be disposed at the same level. The $\phi_2$ and $\phi_4$ electrodes are formed of aluminum, whereas the $\phi_1$ and $\phi_3$ electrodes are formed of polysilicon; it is noted that the polysilicon may be deposited in smaller areas than aluminum. To ensure the accurate dielectric isolation of all polysilicon electrodes, the polysilicon is oxidized as shown in FIG. 13G at a relatively high temperature as described above. This oxidation is carried out at such times and temperatures and in an atmosphere such that the silicon oxide layer 112 is grown without damage to the memory MNOS devices 22 or to the interface between layers 72 and 74.

Having formed the dielectric layer 112 over the polysilicon region 110, it is now necessary to open the contact windows in the nitride-oxide sandwich and the via windows between the polysilicon and metal where desired, illustrated in FIG. 13H. This can be accomplished by several techniques. In a first illustrative method, a 2 kA silox layer is deposited over the entire wafer. The contact windows to the substrate, through the nitride layer 75, are defined in the silox layer. The nitride layer 75 is then etched using hot phosphoric acid. The acid will not etch the underlying oxide and therefore the process is self-limiting. Since the resist was stripped prior to the acid etch, a second resist layer is spun on. The combination mask of the vias and the contact windows is defined in the resist and the oxide over the polysilicon and beneath the nitride, then is chemically etched. The advantage of this double masking is that any pinhole that was in the first photoresist layer and thus in the nitride, is masked from the oxide etch by the second photoresist layer. The disadvantage is the need for the silox overcoat to etch the nitride, which is a critical process regarding phosphorous contamination of the silox, and the necessity of two photoengraving steps.

The alternate approach is to use a single masking step and a plasma etching process. A silox layer is not needed and only a single photomask, a composite of vias and contact windows, is required. The pattern is defined in the resist, and the nitride layer 75 is etched by the plasma etcher. The plasma will etch only the nitride layer 75 and again is a self-limiting process. Having etched the nitride layer 75, the original photoresist layer can be used to chemically etch the remaining oxide layers. Care must be taken, however, to reflow the photoresist between the plasma and chemical etch steps. If the resist is not reflowed, pinholes in the resist will be propagated completely through the nitride and oxide directly to the substrate, resulting in metal-to-substrate shorting.

Having opened the contact and via windows, the wafers are metallized, as shown in FIG. 13J. Either a conventional etching process or a lift-off process may be used. Although lift-off incurs one additional step, its edge definition and lack of undercutting are definite advantages. However, metal thicknesses are restricted to less than 7 kA and poor adhesion of the photoresist to the wafer during premetal HF dip cleaning and during the evaporation can cause problems in fine line definition.

It is desirable to use an aluminum-silicon alloy as the metallization to form electrodes 100 due to the shallow diffusions being used. The alloy is evaporated from a single crucible, typical 70 percent Al, 30 percent Si, by electron beam techniques. The resultant alloy on the wafer has approximately 1.5% silicon. This is near the solid solubility of silicon in aluminum at the temperature typically used to sinter the metallization, thus reducing the possibility of sinter pits forming.

To complete the processing, the devices are given a 13 kA protection phos-doped silox overcoat to provide reliable devices. Finally, the bonding pads are then opened in the silox.

Numerous changes may be made in the above-described apparatus and the different embodiments of the invention may be made without departing from the spirit thereof. For example, the assembly including the basic serial-in, parallel-out CCD, an array of memory devices such as MNOS FET's and suitable summing circuitry may be adapted for many applications requiring complex processing of signal information such as transverse filters, radar signal processing, filter banks, sonar signal processing, range resolution and active sonars and communication systems as disclosed in the "Study of the Use of Charge Coupled Devices and Analog Signal Processing Systems", by M. H. White and W. R. Webb, and in "CCD's for Discrete Analog Processing (DASP)", by D. R. Lampe, M. H. White, J. H. Mims, W. R. Webb and G. A. Gilmour. Therefore, it is intended that all matter contained in the foregoing description and in the accompanying drawings shall be interpreted as illustrative and not in a limiting sense.

What is claimed is:

1. A discrete analog signal processing system for processing an analog input signal in accordance with a pattern of weighting factors, said system comprising:
   a. a plurality of memory elements, each capable of storing an analog weighting factor of the pattern and responsive to a portion of the input signal applied thereto for providing an element output indicative of the product of the stored weighting factor and an input signal applied thereto;
   b. an output conductor coupled to receive the element outputs of each of said memory elements;
   c. converter means comprising a plurality of stages, each coupled to corresponding memory elements and responsive to an input signal for disposing sequentially portions of the input signal at each of its stages, whereby a signal portion is applied from its stage to its corresponding memory element;
   d. means for providing a programming signal for a selected memory element corresponding to the weighting factor to be stored therein; and
   e. register means comprising a plurality of stages corresponding to those of said converter means for deriving sequentially from said register means an enabling output for permitting the application of the programming signal successively to each of said memory elements whereby each of said memory elements is programmed with its corresponding weighting factor.

2. The discrete analog signal processing system as claimed in claim 1, wherein there is further included a plurality of switches corresponding to each of said memory elements, each of said switches responsive to the enabling output of the corresponding stage of said register means for applying the programming signal to its corresponding memory element.

3. The discrete analog signal processing system as claimed in claim 1, wherein said converter means comprises a charge-transfer device and each of said memory elements comprises an MNOS field effect transistor.

4. The discrete analog signal processing system as claimed in claim 3, wherein said MNOS field effect transistor and said charge-transfer device are formed upon a common semiconductor substrate.

5. A discrete analog signal processing system for processing an input signal in accordance with a pattern of weighting factors, said system comprising:
   a. a matrix of memory elements disposed in rows and columns, each of said memory elements comprises an MNOS field effect transistor and capable of storing an analog weighting factor of the pattern and responsive to a portion of the input signal applied thereto for providing an element output indicative of the product of the stored weighting factor and the input signal portion, said matrix further comprising first sets of row and column conductors coupled to the corresponding memory elements of said matrix and means for isolating one row of said memory elements from the remaining rows thereof;
   b. first converter means comprising a plurality of stages, each coupled to corresponding column conductors and responsive to the input signal for disposing sequentially a portion of the input signal at each of its stages, whereby a signal portion is applied through its corresponding column conductor to those memory elements of that column;
   c. second converter means comprising a plurality of stages, each coupled to a row conductor of said matrix, for summing and storing the element outputs of those memory elements of that row and operative to sequentially read out the plurality of summed row signals; and
   d. means for programming the pattern of weighting factors onto corresponding ones of said memory elements, said programming means including first generator means for applying programming signals to each of said row regions, a second set of column conductors coupled to the gate electrodes of said memory element of that column, and second generator means for applying programming signals to each of said column conductors of said second set.

6. The discrete analog signal processing system as claimed in claim 5 wherein said plurality of MNOS field effect transistors is formed on a common substrate, and said isolation means comprises a row region of said substrate encompassing said one row of a conductivity opposite to that of said substrate.

7. The discrete analog signal processing system as claimed in claim 6, wherein each of said MNOS field effect-transistors includes a drain electrode coupled to its corresponding column conductor of said first set and a source electrode coupled to its corresponding row conductor of said first set.

8. A discrete analog signal processing system for processing an input signal in accordance with a pattern of weighting factors, said system comprising:
   a. a matrix of memory elements disposed in rows and columns, each of said memory elements capable of storing an analog weighting factor of the pattern and responsive to a portion of the input signal applied thereto for providing an element output indicative of the product of the stored weighting factor and the input signal portion, said matrix further comprising first sets of row and column conductors coupled to the corresponding memory elements of said matrix;
   b. first converter means comprising a plurality of stages, each coupled to corresponding column conductors and responsive to the input signal for disposing sequentially a portion of the input signal at each of its stages, whereby a signal portion is applied through its corresponding column conductor to those memory elements of that column, said first converter means comprises a charge-transfer device (CTD) including a plurality of cells sequentially aligned along the length of said CTD, each of said cells having a plurality of wells formed therein whereby the input signal portions are transferred from cell to cell along the length of said CTD, selected of said cells having output means associated with one of its wells;
   c. second converter means comprising a plurality of stages, each coupled to a row conductor of said matrix, for summing and storing the element outputs of those memory elements of that row and operative to sequentially read out the plurality of summed row signals; and
   d. means for applying a programming signal to each of said memory elements whereby the analog weighting factor is stored therein.

9. The discrete analog signal processing system as claimed in claim 8, wherein said CTD comprises a silicon substrate of a first type of conductivity, a first layer of silicon dioxide disposed upon said substrate and said output means comprising a region formed within said substrate of a conductivity type opposite to that of said substrate.

10. The discrete analog signal processing system as claimed in claim 9, wherein said output means is associated with alternate cells along the length of said CTD and there is included multiplex means for generating and applying a series of the signal samples and reference level samples to said first converter means with the reference level samples selectively interspersed between the signal samples, clock means for applying a plurality of clock signals to corresponding wells of each of said cells of said CTD whereby the signal samples and the interspersed reference level samples are sequentially moved from cell to cell along the length of said CTD, and processing means for receiving the summed row signals and comprising storage means actuated for storing the reference level samples appearing at said electrodes at a first instant in time and means actuated at a second subsequent instant for differencing the instant input signal samples received and the stored reference level samples, said clock means shifts the instant input signal samples and said reference level samples from cell to cell along the length of said CTD in a manner such that at a third instant in time said wells associated with said output means are empty and an output is derived upon said row conductor indicative of the reset noise present within said CCD, for each signal sample and each reference level sample.

11. The discrete analog signal processing system as claimed in claim 10, wherein said processing means further comprises second storage means for storing the row output signal corresponding to reset noise and said differencing means actuated for subtracting the stored reset noise level from the output signal sample, whereby the reset noise component of the input signal is effectively removed.

12. A discrete analog signal processing system for processing an input signal in accordance with a pattern of weighting factors, said system comprising:
   a. a matrix of memory elements disposed in rows and columns, each of said memory elements capable of storing an analog weighting factor of the pattern and responsive to a portion of the input signal applied thereto for providing an element output indicative of the product of the stored weighting factor and the input signal portion, said matrix further comprising first sets of rows and column conductors coupled to the corresponding memory elements of said matrix;
   b. first converter means comprising a plurality of stages, each coupled to corresponding column conductors and responsive to the input signal for disposing sequentially a portion of the input signal at each of its stages, whereby a signal portion is applied through its corresponding column conductor to those memory elements of that column;
   c. second converter means comprising a plurality of stages, each coupled to a row conductor of said matrix, for summing and storing the element outputs of those memory elements of that row and operative to sequentially read out the plurality of summed row signals;
   d. programming generator means for applying conductance programming signals to each of said memory devices for storing therein a weighting factor in accordance with the pattern of weighting factors;
   e. means for applying a test signal to a selected one of said memory elements, whereby a memory element output is derived indicative of the weighting factor of said selected memory element; and
   f. comparator means responsive to the memory element output indicative of the weighting factor programmed on said selected memory element for comparing same with a reference value of the weighting factor for said selected memory element to derive an error signal for adjustably controlling said programming generator means to apply program signals to said selected memory element, whereby the weighting factor stored therein is adjusted in accordance with the error signal.

13. The discrete analog signal processing system as claimed in claim 12 wherein there is included storage means for storing the pattern of weighting factors and for sequentially reading out a selected one of said weighting factors to be applied to said comparator means.

14. The discrete analog signal processing system as claimed in claim 12, wherein there is included a first plurality of row driver circuits coupled to apply first write signals to the memory elements of one row of said matrix and a second plurality of driver circuits coupled to apply second write signals to the memory elements of one column of said matrix and row and column address circuits responsive, respectively, to row and column address signals for selectively applying an actuating signal to one of said first and second pluralities of driver circuits, whereby write signals are applied to the one addressed memory element of said matrix.

15. A method of programming an analog signal processing system comprising a plurality of memory elements, each for receiving and storing a corresponding one of a set of weighting factors, first converter means for receiving a train of input signals and applying input signals to corresponding of said memory elements, and output means for receiving and summing outputs from said memory elements indicative of the product of the weighting factors and the input signals from selected of said memory elements, said method comprising the steps of:
   a. storing the set of reference program factors in storage means;
   b. sequentially deriving from the storage means one of the reference programming factors and programming the corresponding memory element in accordance therewith;
   c. sequentially testing each memory element to drive an output indicative of the weighting factor stored therein; and
   d. comparing the output derived from the tested memory element with the corresponding reference programming factor as stored in said storage means.

16. The method of programming as claimed in claim 15, wherein said step of comparing includes providing a difference signal indicative of the difference between the reference program factor and the output as derived from the tested memory element.

17. The method of programming as claimed in claim 16, wherein the tested memory element is reprogrammed in accordance with the difference signal until the difference signal is within an acceptably small range indicative that the weighting factor as stored therein is sufficiently equal to the corresponding reference weighting factor as stored in the storage means.

* * * * *